United States Patent
Bates et al.

(10) Patent No.: US 11,738,366 B2
(45) Date of Patent: *Aug. 29, 2023

(54) METHOD OF COATING AN OBJECT

(71) Applicant: The Regents of the University of California, Oakland, CA (US)

(72) Inventors: Christopher Bates, Santa Barbara, CA (US); Yuanyi Zhang, Santa Barbara, CA (US)

(73) Assignee: The Regents of the University of California, Oakland, CA (US)

(*) Notice: Subject to any disclaimer, the term of this patent is extended or adjusted under 35 U.S.C. 154(b) by 649 days.

This patent is subject to a terminal disclaimer.

(21) Appl. No.: 16/549,490

(22) Filed: Aug. 23, 2019

(65) Prior Publication Data
US 2020/0238329 A1 Jul. 30, 2020

Related U.S. Application Data

(60) Provisional application No. 62/796,753, filed on Jan. 25, 2019.

(51) Int. Cl.
*B05D 1/32* (2006.01)
*C09D 133/02* (2006.01)
(Continued)

(52) U.S. Cl.
CPC ............... *B05D 1/32* (2013.01); *B05D 1/002* (2013.01); *B05D 1/005* (2013.01); *C08F 293/005* (2013.01); *C09D 125/06* (2013.01); *C09D 133/02* (2013.01); *C09D 155/005* (2013.01); *B05D 1/36* (2013.01); *C08F 2438/01* (2013.01); *G03F 7/162* (2013.01); *H01L 21/6715* (2013.01)

(58) Field of Classification Search
CPC ........ B05D 1/005; B05D 3/002; B05D 1/002; B05D 1/32; B05D 3/02; G03F 7/162
USPC ...................... 427/240, 998.5, 98.5
See application file for complete search history.

(56) References Cited

U.S. PATENT DOCUMENTS 4,576,834 A 3/1986 Sobczak
7,776,758 B2 8/2010 Heald et al.
(Continued)

FOREIGN PATENT DOCUMENTS

CN 1535305 A 10/2004
EP 0662683 A1 * 7/1995
(Continued)

OTHER PUBLICATIONS

Ferrell et al. "Fabrication of Micro and nanoscale polymer structures by soft lithography and spin dewetting", Macromolecular Rapid Communications, 2007 vol. 28, pp. 966-971 (Year: 2007).*
(Continued)

*Primary Examiner* — Brian K Talbot
(74) *Attorney, Agent, or Firm* — Withrow & Terranova, P.L.L.C.

(57) ABSTRACT

Disclosed is a method of coating an object made of a first material and a second material that is different from the first material. The method includes dispensing a polymer solution onto the object, wherein the polymer solution has a property that wets one of the first material and the second material and dewets the other one of the first material and the second material.

16 Claims, 29 Drawing Sheets

(51) Int. Cl.
| | |
|---|---|
| C09D 125/06 | (2006.01) |
| B05D 1/00 | (2006.01) |
| C08F 293/00 | (2006.01) |
| C09D 155/00 | (2006.01) |
| H01L 21/67 | (2006.01) |
| G03F 7/16 | (2006.01) |
| B05D 1/36 | (2006.01) |

(56) References Cited

U.S. PATENT DOCUMENTS

| | | | |
|---|---|---|---|
| 8,263,192 | B2 | 9/2012 | Koberstein et al. |
| 10,157,740 | B1 | 12/2018 | Ouyang et al. |
| 10,239,980 | B2 * | 3/2019 | Lee .......... C07C 35/48 |
| 10,492,305 | B2 | 11/2019 | Stay et al. |
| 10,643,840 | B2 * | 5/2020 | Anthis ............ H01L 21/0337 |
| 10,790,138 | B2 | 9/2020 | Azumo |
| 2004/0102050 | A1 | 5/2004 | Delamarche et al. |
| 2009/0004507 | A1 * | 1/2009 | Suzuki ............ H01L 51/0039 |
| | | | 428/704 |
| 2011/0034033 | A1 | 2/2011 | Halls et al. |
| 2012/0315740 | A1 | 12/2012 | Yao |
| 2014/0027727 | A1 * | 1/2014 | Lee ............ H01L 51/5268 |
| | | | 257/40 |
| 2014/0314982 | A1 * | 10/2014 | Paxson ............ F28F 13/04 |
| | | | 427/255.39 |
| 2015/0027769 | A1 * | 1/2015 | Sebastien ............ B05D 3/107 |
| | | | 174/262 |
| 2015/0217330 | A1 | 8/2015 | Haukka et al. |
| 2016/0003760 | A1 * | 1/2016 | Etzkorn ............ G02C 11/10 |
| | | | 204/406 |
| 2016/0251303 | A1 * | 9/2016 | Moore ............ B05D 1/005 |
| | | | 428/220 |
| 2017/0037513 | A1 | 2/2017 | Haukka et al. |
| 2017/0323776 | A1 | 11/2017 | Färm et al. |
| 2017/0323781 | A1 | 11/2017 | Kachian et al. |
| 2018/0012752 | A1 | 1/2018 | Tapily |
| 2018/0217312 | A1 * | 8/2018 | Hiraoka ............ G11B 7/24044 |
| 2018/0233349 | A1 | 8/2018 | Smith et al. |
| 2018/0366317 | A1 | 12/2018 | Ke et al. |
| 2019/0157079 | A1 | 5/2019 | Ke et al. |
| 2019/0295943 | A1 * | 9/2019 | Tan ............ H01L 21/76816 |
| 2019/0316256 | A1 | 10/2019 | Bhuyan et al. |
| 2019/0326114 | A1 | 10/2019 | Kachian et al. |
| 2019/0384161 | A1 | 12/2019 | Mirkin et al. |
| 2020/0238331 | A1 | 7/2020 | Bates et al. |

FOREIGN PATENT DOCUMENTS

| | | |
|---|---|---|
| GB | 2455746 A | 6/2009 |
| KR | 20060003332 A | 1/2006 |

OTHER PUBLICATIONS

Final Office Action for U.S. Appl. No. 16/697,288, dated Jul. 27, 2021, 15 pages.
Advisory Action for U.S. Appl. No. 16/697,288, dated Sep. 23, 2021, 3 pages.
Non-Final Office Action for U.S. Appl. No. 16/697,288, dated Oct. 18, 2021, 15 pages.
Non-Final Office Action for U.S. Appl. No. 16/697,288, dated Mar. 12, 2021, 17 pages.
Final Office Action for U.S. Appl. No. 16/697,288, dated Mar. 18, 2022, 15 pages.
Advisory Action for U.S. Appl. No. 16/697,288, dated May 23, 2022, 3 pages.
Non-Final Office Action for U.S. Appl. No. 16/697,288, dated Jul. 25, 2022, 17 pages.
Notice of Allowance and Examiner-Initiated Interview Summary for U.S. Appl. No. 16/697,288, dated Jan. 18, 2023, 10 pages.
Bally-Le Gall, F. et al., "Free-Standing Nanomembranes Based on Selective CVD Deposition of Functional Poly-p-xylylenes," ACS Nano, vol. 9, Issue No. 2, Feb. 3, 2015, American Chemical Society, 8 pages.
Bhandaru, N. et al., "Ordered Alternating Binary Polymer Nanodroplet Array by Sequential Spin Dewetting," Nano Letters, vol. 14, May 30, 2017, American Chemical Society, 8 pages.
Bhandaru, N. et al., "Directed Ordering of Phase Separated Domains and Dewetting of Thin Polymer Blend Films on a Topographically Patterned Substrate," Soft Matter, vol. 13. 2017, Royal Society of Chemistry, 11 pages.
Boltau, M. et al., "Surface-induced structure formation of polymer blends on patterned substrates," Letters to Nature, vol. 391, Feb. 26, 1998, pp. 877-879.
Briggs, B. et al., "Fully Aligned Via Integration for Extendibility of Interconnects to Beyond the 7 nm Node," 2017 IEEE International Electron Devices Meeting (IEDM), 2017, IEEE, 4 pages.
Chavez, K. et al., "A Novel Method of Etching Copper Oxide Using Acetic Acid," Journal of The Eletrochemical Society, vol. 148, Issue No. 11, Oct. 8, 2001, The Electrochemical Society, Inc., 4 pages.
Chen, H.Y. et at, "Substrate-Selective Chemical Vapor Deposition of Reactive Polymer Coatings," Advanced Materials, vol. 20, Sep. 5, 2008, WILEY-VCH Verlag GmbH & Co. KGaA, Weinheim, 7 pages.
Chen, Y. et al. "Technological Merits, Process Complexity, and Cost Analysis of Self-aligned Multiple Patterning," SPIE Advanced Lithography, 2012, San Jose, California, United States, Optical Microlithography vol. XXV, Issue No. 832620, SPIE, Mar. 13, 2012, 15 pages.
Chiu, M. et al., "Aligned Droplet Patterns by Dewetting of Polymer Bilayers", Macromolecules, vol. 51, Issue No. 15, Jul. 5, 2018, American Chemical Society Publications, 9 pages.
Dhara, P. el al., "Transition from Spin Dewetting to Continuous Film in Spin Coating of Liquid Crystal 5CB", Scientific Reports, vol. 8, Issue No. 7169, May 8, 2018, www.nature.com, 9 pages.
Discekici, E.H. et al., "Light-Mediated Atom Transfer Radical Polymerization of Semi-Fluorinated (Meth)acrylates: Facile Access to Functional Materials," Journal of the American Chemical Society, vol. 139, 2017, ACS Publications, 7 pages.
Fang, M. et al., "Area-Selective Atomic Layer Deposition: Conformal Coating, Subnanometer Thickness Control, and Smart Positioning," ACS Nano, vol. 9, Issue No. 9, Sep. 9, 2015, American Chemical Society Publications, 4 pages.
Ferrell, N. et al., "Fabrication of Micro- and Nanoscale Polymer Structures by Soft Lithography and Spin Dewetting," Macromolecular Rapid Communications, vol. 28, 2007, WILEY-V CH Verlag GmbH, pp. 966-971.
Geoghegan, M. et al., "Thin Polymer Films on Chemically Patterned, Corrugated Substrates," Journal of Physics Condensed Matter, vol. 17, Issue No. 9, IOP Publishing, LTD , Feb. 18, 2005, 15 pages.
Glass, N. et al., "Organosilane Deposition for Microfluidic Applications," Biomicrofluidics, vol. 5, Issue No. 3, Aug. 16, 2011, American Institute of Physics, 7 pages.
Grischuk, A. et al., "Viscosity of Concentrated Solutions of Polystyrene and Poly(Vinyl Acetate) (Empirical Equations)," Russian Journal of Applied Chemistry, Macromolecular Chemistry and Polymeric Materials, vol. 80, Issue No. 11, Nov. 2007, Pleiades Publishing, Ltd., 5 pages.
Hall, D.B. et al., "Spin Coating of Thin and Ultrathin Polymer Films," Polymer Engineering and Science, vol. 38, No. 12, Dec. 1998, 7 pages.
Johnson, A. "Micrometre and Nanometre Scale Patterning of Binary Polymer Brashes, Supported Lipid Bilayers and Proteins," Chemical Science, vol. 8, Issue No. 4517, Apr. 18, 2017, The Royal Society of Chemistry, 10 pages.
Kalanyan, B. "Using Hydrogen To Expand the Inherent Substrate Selectivity Window During Tungsten Atomic Layer Deposition," Chemistry of Materials, vol. 28, Issue No. 1, Dec. 15, 2015, American Chemical Society Publications, 10 pages.
Kim, W.-H. et al., "A Process for Topographically Selective Deposition on 3D Nanostructures by Ion Implantation," ACS Nano, 2016, vol. 10, ACS Publications, 8 pages.
Lee, J.H., et al., "Spontaneous Registration of Sub-10 nm Features Based on Subzero Celsius Spin-Casting of Self-Assembling Build-

(56) References Cited

OTHER PUBLICATIONS ing Blocks Directed by Chemically Encoded Surfaces," ACS Nano, Issue 12, vol. No. 8, Aug. 1, 2018, ACS Publications, 10 pages.

Li, M.-Y. et al., "Self-Aligned and Scalable Growth of Monolayer WSe2-MoS2 Lateral Heterojunctions," Advanced Functional Materials, vol. 28, 2018, WILEY-V CH Verlag GmbH, 7 pages.

Liu, J., et al., "Generation of Oxide Nanopatterns by Combining Self-Assembly of S-Layer Proteins and Area-Selective Atomic Layer Deposition," Journal of the American Chemical Society, vol. 130, Issue No. 50, Nov. 19, 2008, American Chemical Society, 6 pages.

Lu, G. et al., "Fabricating Ordered Two-Dimensional Arrays of Polymer Rings with Submicrometer-Sized Features on Patterned Self-Assembled Monolayers by Dewetting," Advanced Materials, vol. 14, No. 15, Aug. 5, 2002, WILEY-V CH Verlag GmbH, pp. 1049-1053.

Mackus, A. et al., "From the Bottom-Up: Toward Area-Selective Atomic Layer Deposition with High Selectivity," Chemistry of Materials, vol. 31, 2019, American Chemical Society, 11 pages.

Mackus, A. et al., "The Use of Atomic Layer Deposition in Advanced Nanopatterning," Nanoscale, vol. 6, 2014, Royal Society of Chemistry, 20 pages.

Meyerhofer, D., "Characteristics of Resist Films Produced by Spinning," Journal of Applied Physics, vol. 49, Issue 7, Aug. 12, 2008, American Institute of Physics, 6 pages.

Park, K. et al., "Light Stamping Lithography: Microcontact Printing without Inks," Journal of the American Chemical Society, vol. 128, 2006, American Chemical Society, pp. 858-865.

Park, K. et al., Microcontact Patterning of Ruthenium Gate Electrodes by Selective Area Atomic Layer Deposition, Applied Physical Letters, vol. 86, Jan. 26, 2005, AIP Publishing, 4 pages.

Prasittichai, C. et al., "Area Selective Molecular Layer Deposition of Polyurea Films," Applied Materials & nterfaces, vol. 5, 2013, 6 pages.

Pujari, S. et al., "Covalent Surface Modification of Oxide Surfaces," Angewandte Chemie International Edition, vol. 53, Oct. 8, 2001, Wiley-VCH Verlag GmbH & Co. KGaA Weinheim, 35 pages.

Reiter, G., "Dewetting of Thin Polymer Films," Physical Review Letters, vol. 68, Issue No. 1, Jan. 6, 1992, The American Physical Society, 6 pages.

Rockford, L. et al., "Polymers on Nanoperiodic, Heterogeneous Surfaces," Physical Review Letters, vol. 82, No. 12, Mar. 22, 1999, The American Physical Society, pp. 2602-2605.

Sadat, F. et al., "A New Resist for Area Selective Atomic and Molecular Layer Deposition on Metal-Dielectric Patterns," The Journal of Physical Chemistry, vol. 118, 2014, ACS Publications, American Chemical Society, 6 pages.

Sehgal, A. et al., "Pattern-Directed Dewetting of Ultrathin Polymer Films," Langmuir, vol. 18, 2002, American Chemical Society, pp. 7041-7048.

Seo, E.K. et al., "Atomic Layer Deposition of Titanium Oxide on Self-Assembled-Monolayer-Coated Gold," Chemistry of Materials, vol. 16, 2004, American Chemical Society, pp. 1878-1883.

Sinha, A. et al., "Area-Selective ALD of Titanium Dioxide Using Lithographically Defined Poly(methyl methacrylate) Films," Journal of The Electrochemical Society, vol. 153, Issue No. 5, Mar. 27, 2006, The Electrochemical Society, 5 pages.

Sprenger, M. et al., "Hierarchical Pattern Replication by Polymer Demixing," Advanced Materials, vol. 15, No. 9, May 2, 2003, WILEY-V CH Verlag GmbH, pp. 703-706.

Wang, X. et al., "PEDOT Surface Energy Pattern Controls Fluorescent Polymer Deposition by Dewetting," Thin Solid Films, vol. 449, Issues 1-2, Feb. 2004, Elsevier B.V., 8 pages.

Wei, M. et al., "Directed Assembly of Polymer Blends Using Nanopatterned Templates", Feb. 9, 2009, WILEY-VCH Verlag GmbH & Co. KGaA, Weinheim, 5 pages.

Zhang, Y. et al., "Rapid and Selective Deposition of Patterned Thin Films on Heterogeneous Substrates via Spin Coating," ACS Applied Materials & Interfaces, vol. 11, 2019, American Chemical Society, 7 pages.

Zhang, Y. et al., "Selective spin-on deposition of polymers on heterogeneous surfaces," Proceedings of SPIE vol. 10960, SPIE Advanced Lithography, 2019 San Jose CA, 11 pages.

Zhang, Z. et al. "Patterning thin polymer Films by Surface-directed Dewetting and Pattern Transfer," Polymer, vol. 44, Issue No. 13, Jun. 2003, Elsevier, 7 pages.

Hashemi, F.S.M., "A New Resist for Area Selective Atomic and Molecular Layer Deposition on Metal-Dielectric Patterns," The Journal of Physical Chemistry, vol. 118, Issue No. 20, May 2, 2014, American Chemical Society Publications, 6 pages.

\* cited by examiner

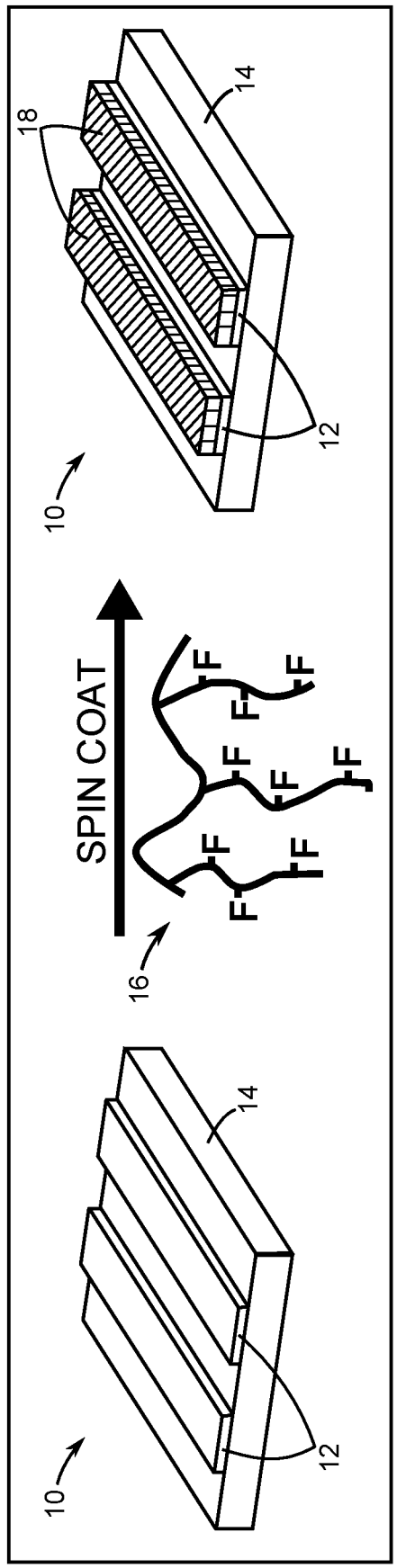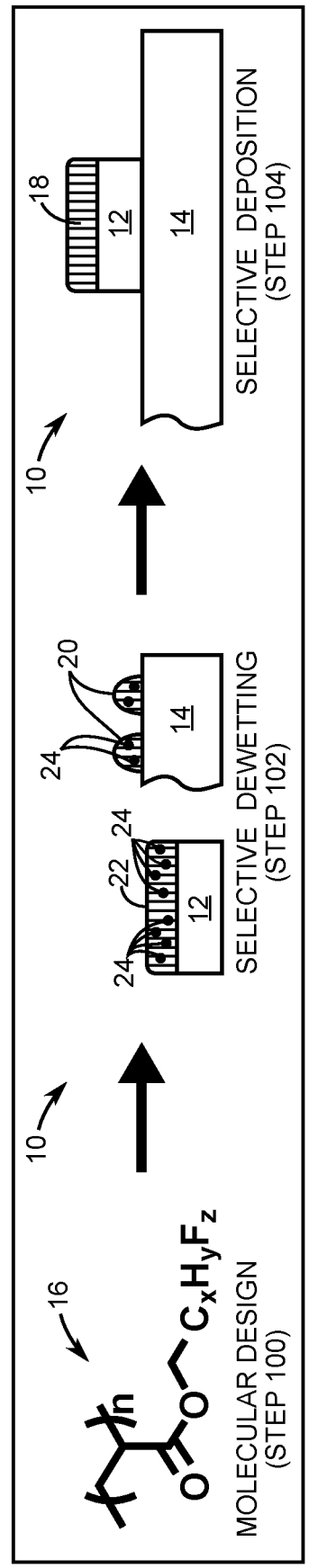

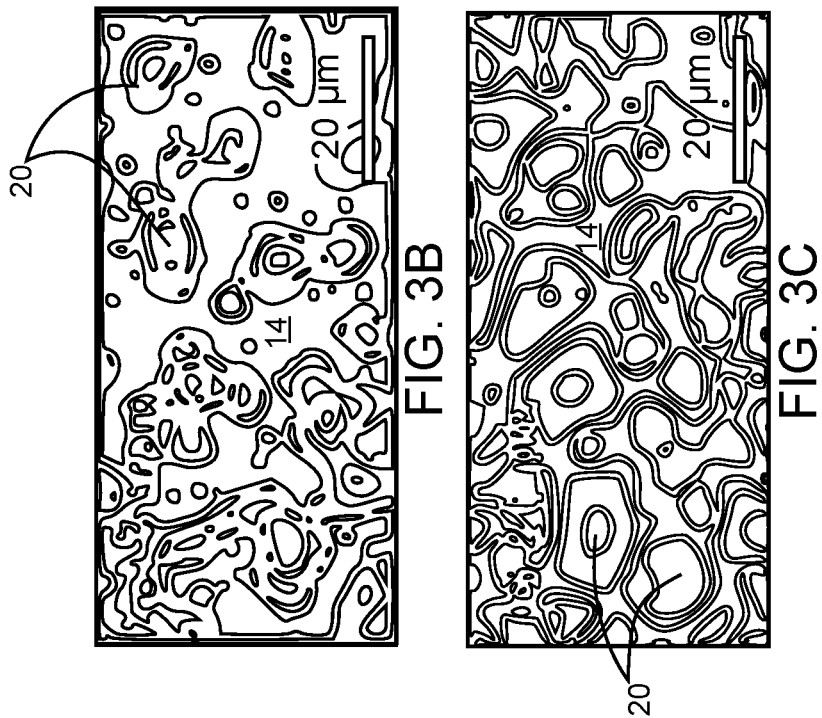
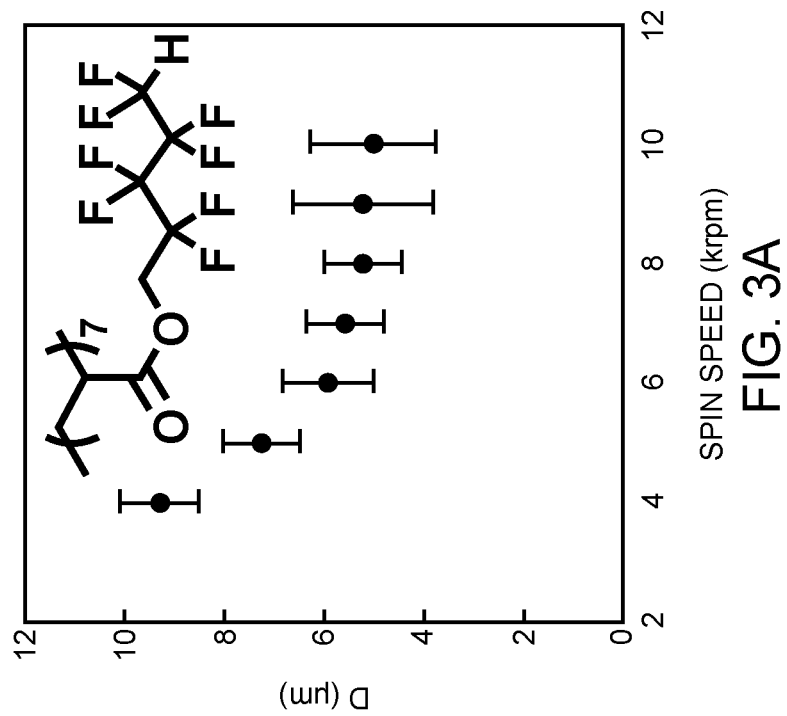
FIG. 3A
FIG. 3B
FIG. 3C

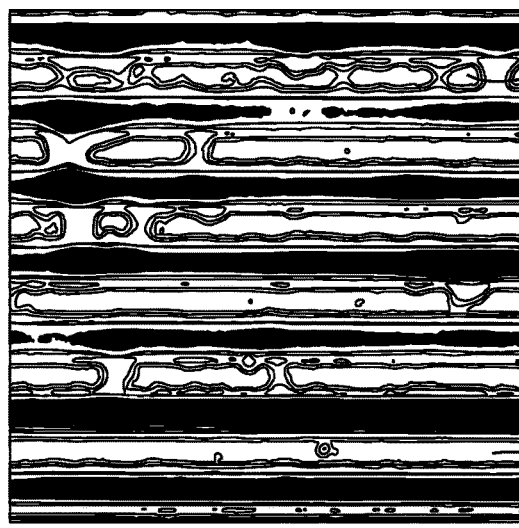
FIG. 4G
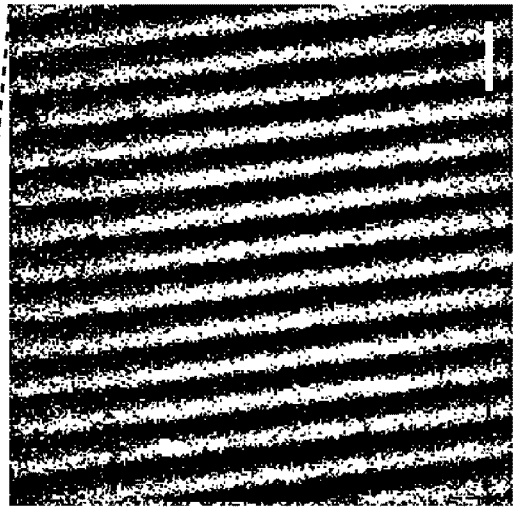
FIG. 4I
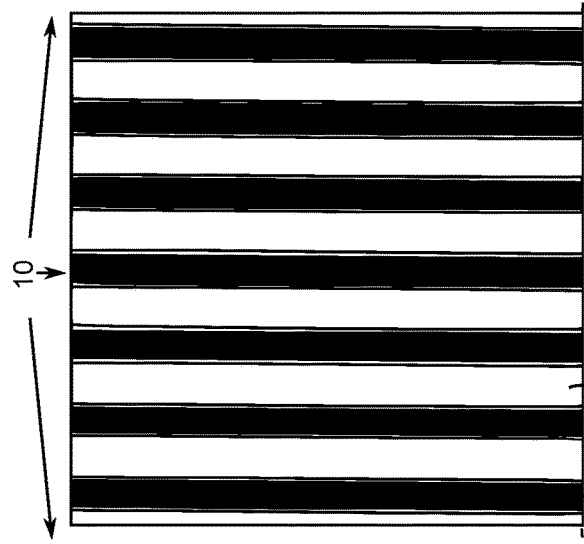
FIG. 4F
FIG. 4E
SPIN COAT
8F₇
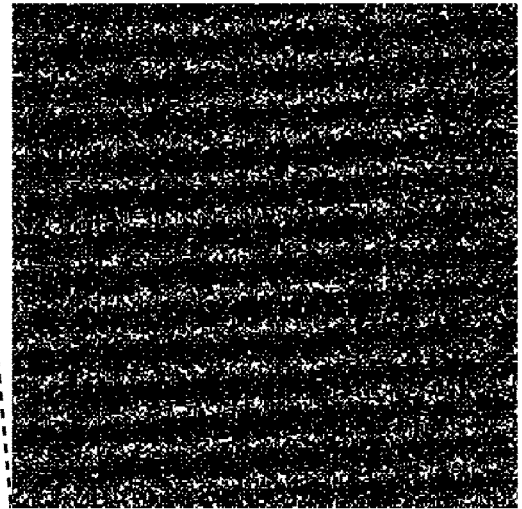
FIG. 4H

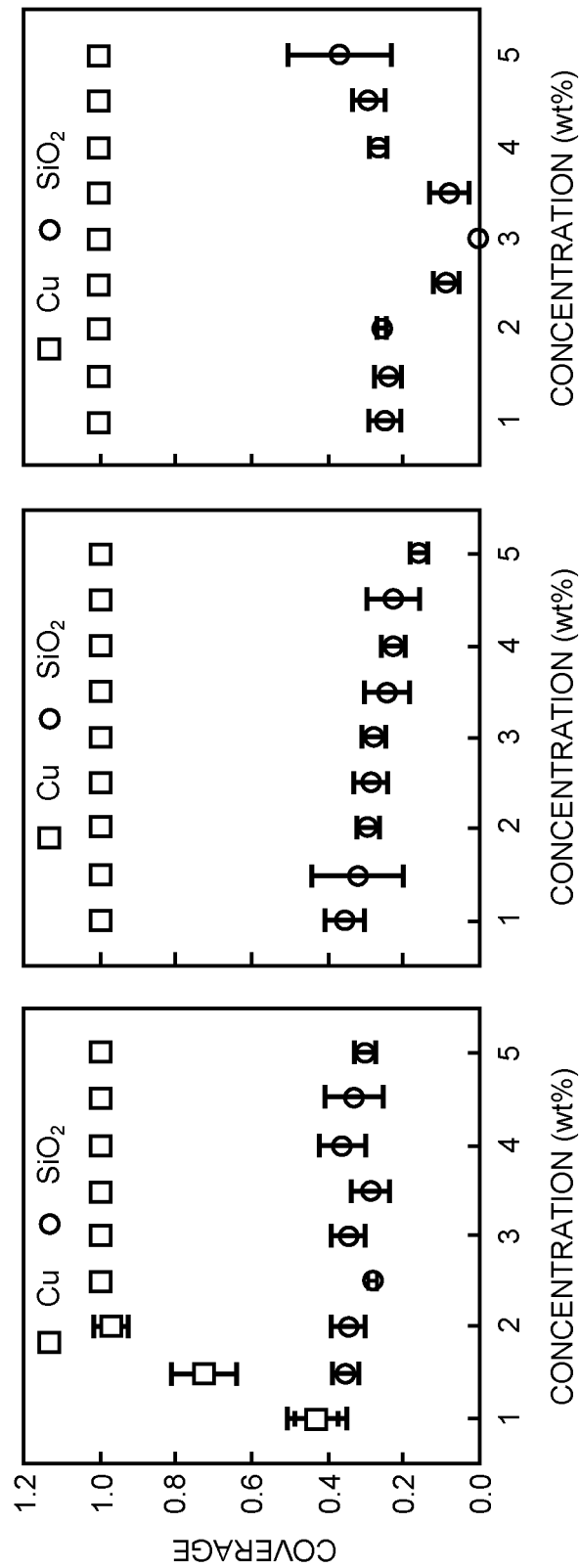

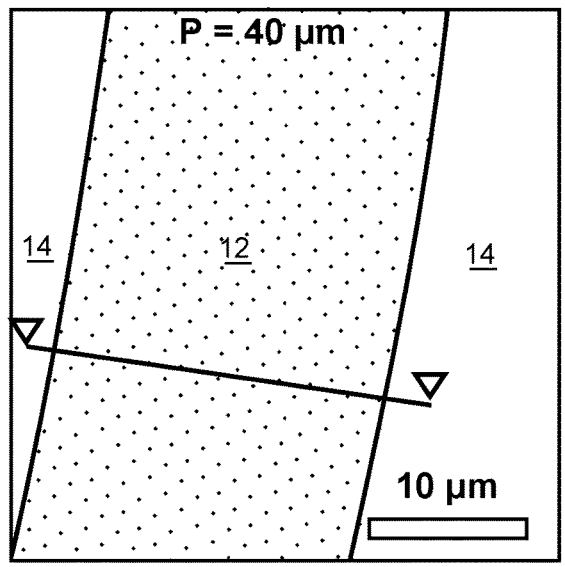 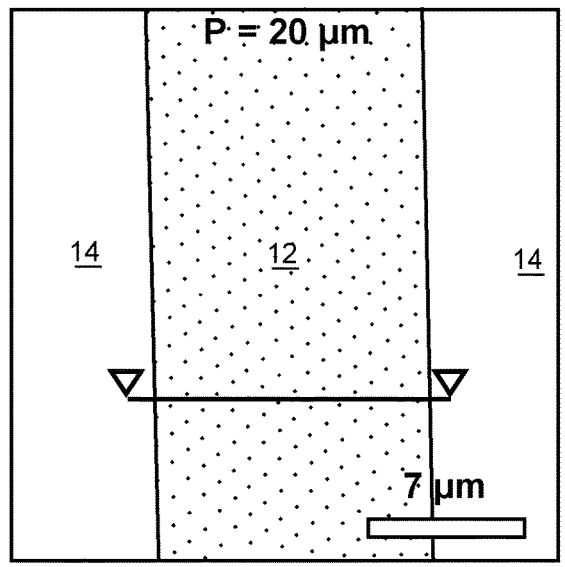
FIG. 7A  FIG. 7B
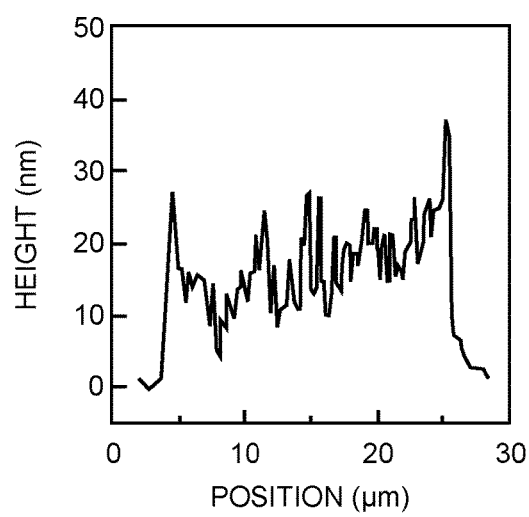 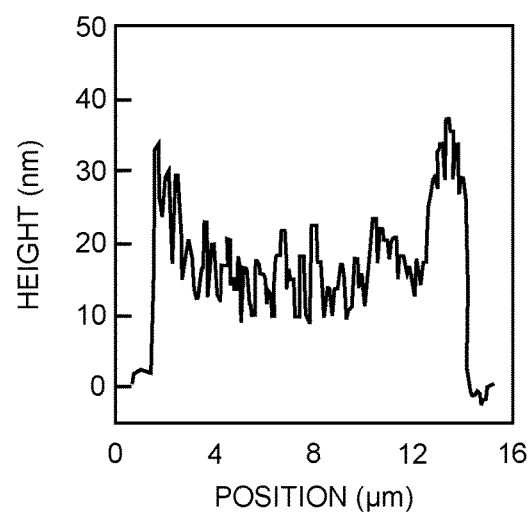
FIG. 7C  FIG. 7D

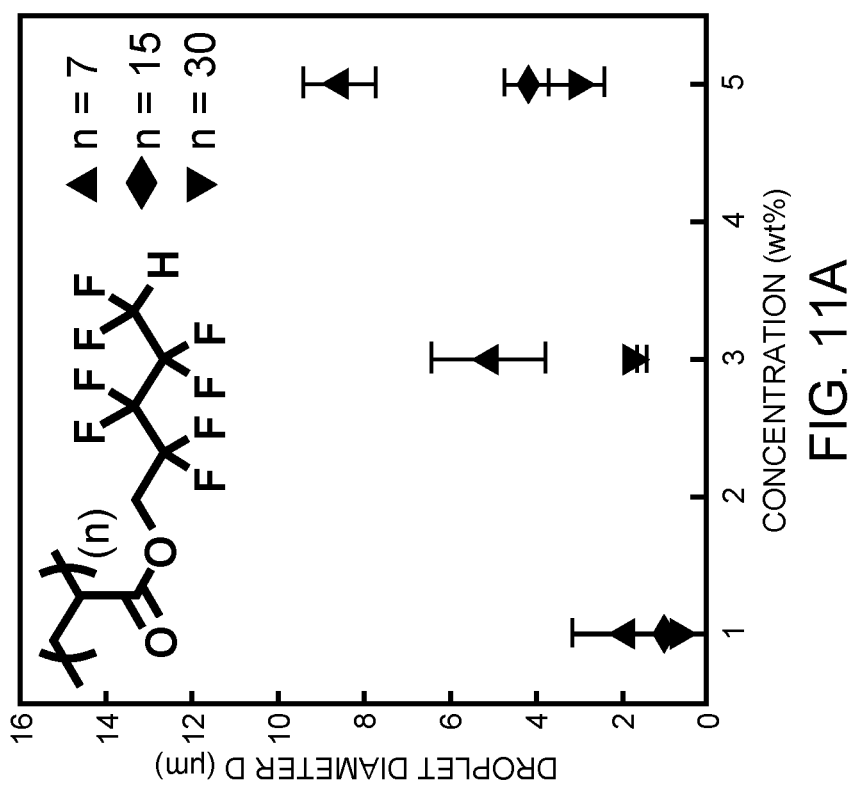
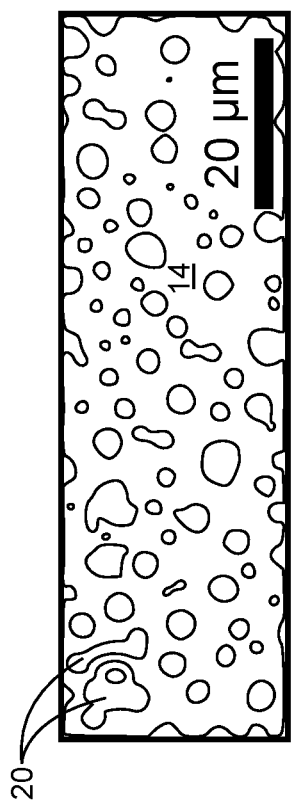
FIG. 11B
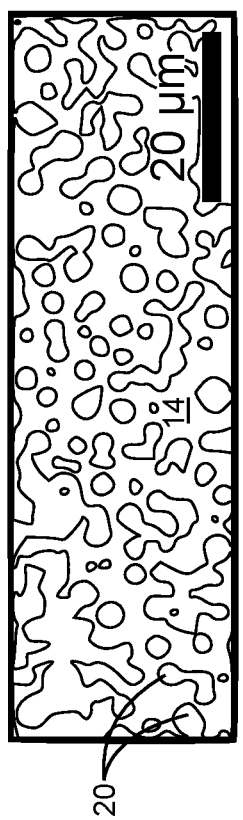
FIG. 11C
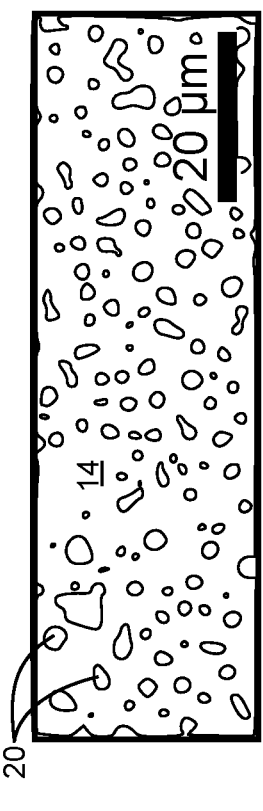
FIG. 11D
FIG. 11A

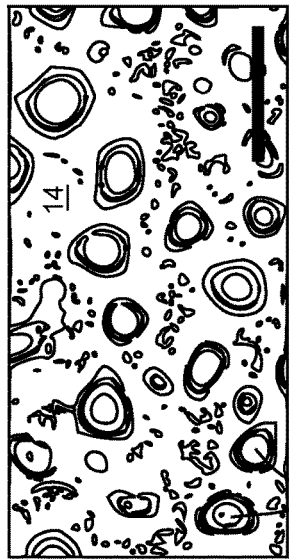
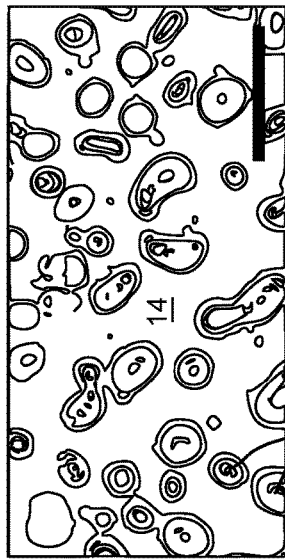
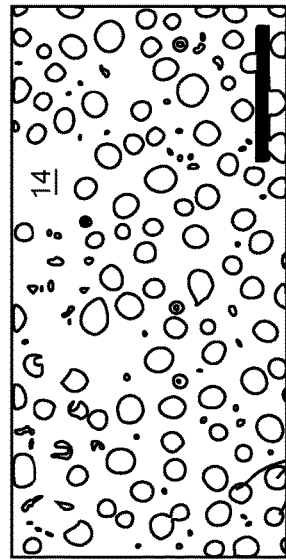
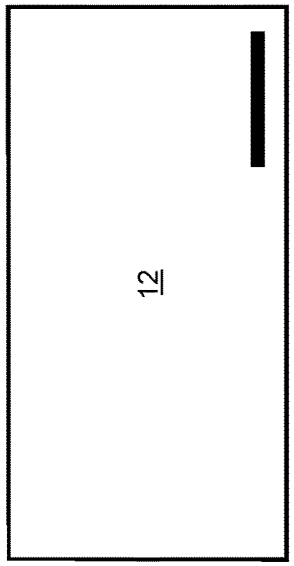
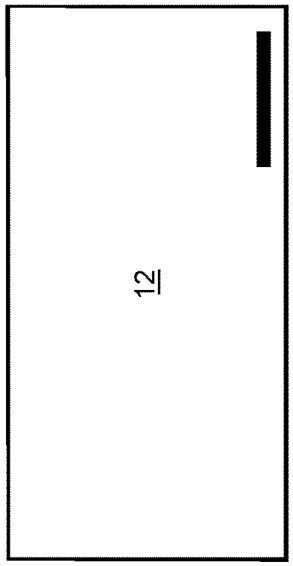
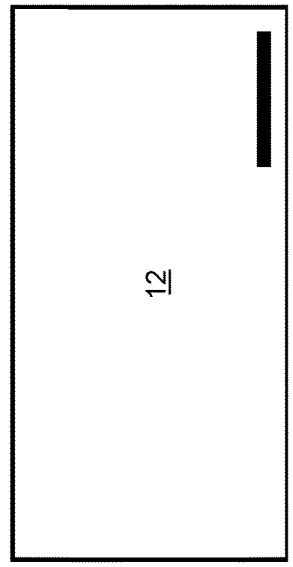
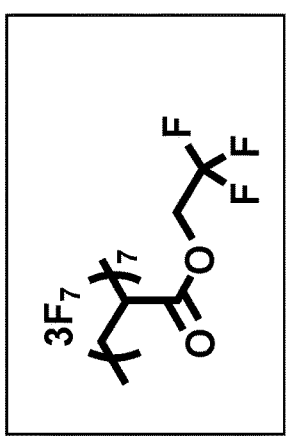
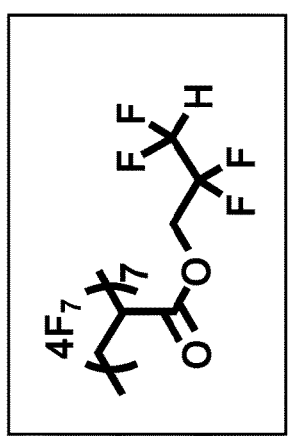
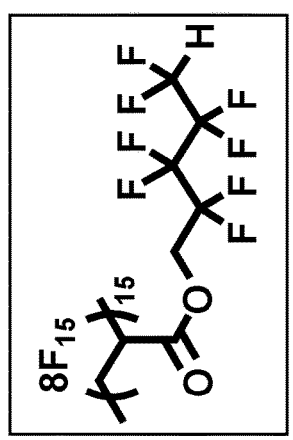
FIG. 12A  FIG. 12B  FIG. 12C
FIG. 12D  FIG. 12E  FIG. 12F
FIG. 12G  FIG. 12H  FIG. 12I

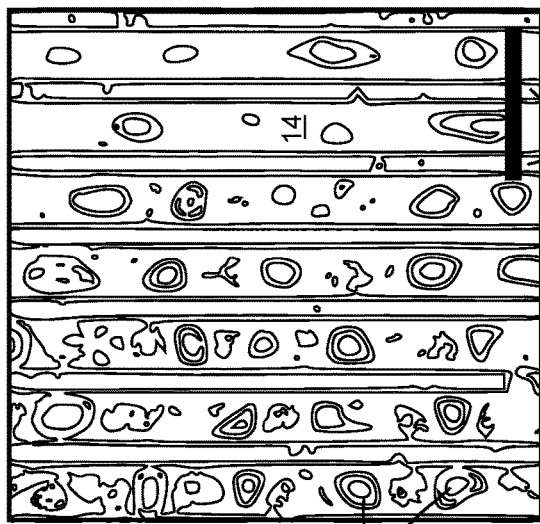
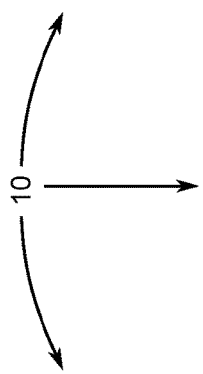
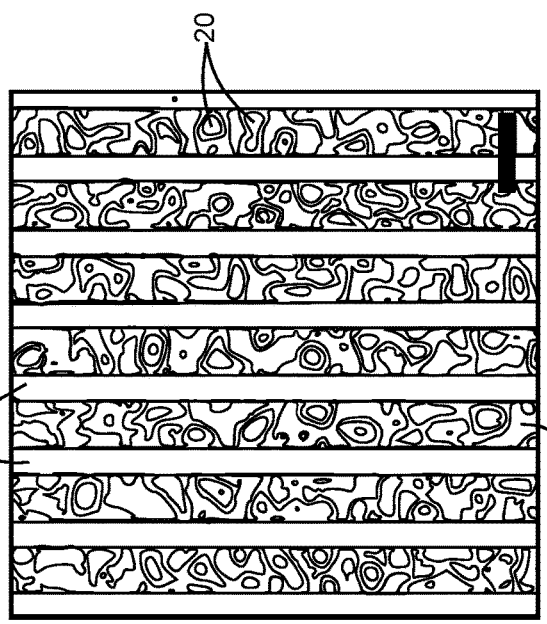
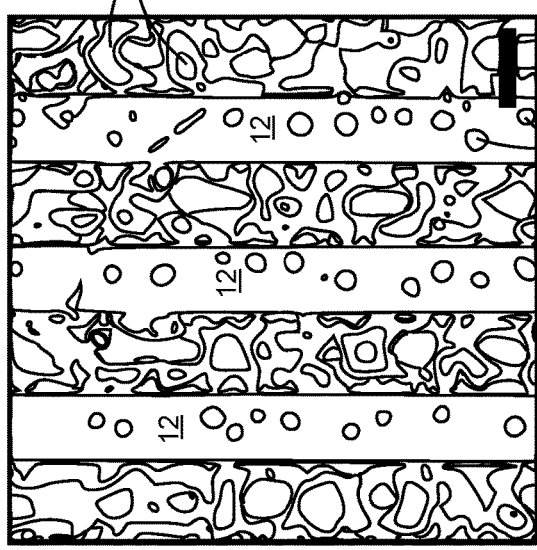
FIG. 14F
FIG. 14E
FIG. 14D

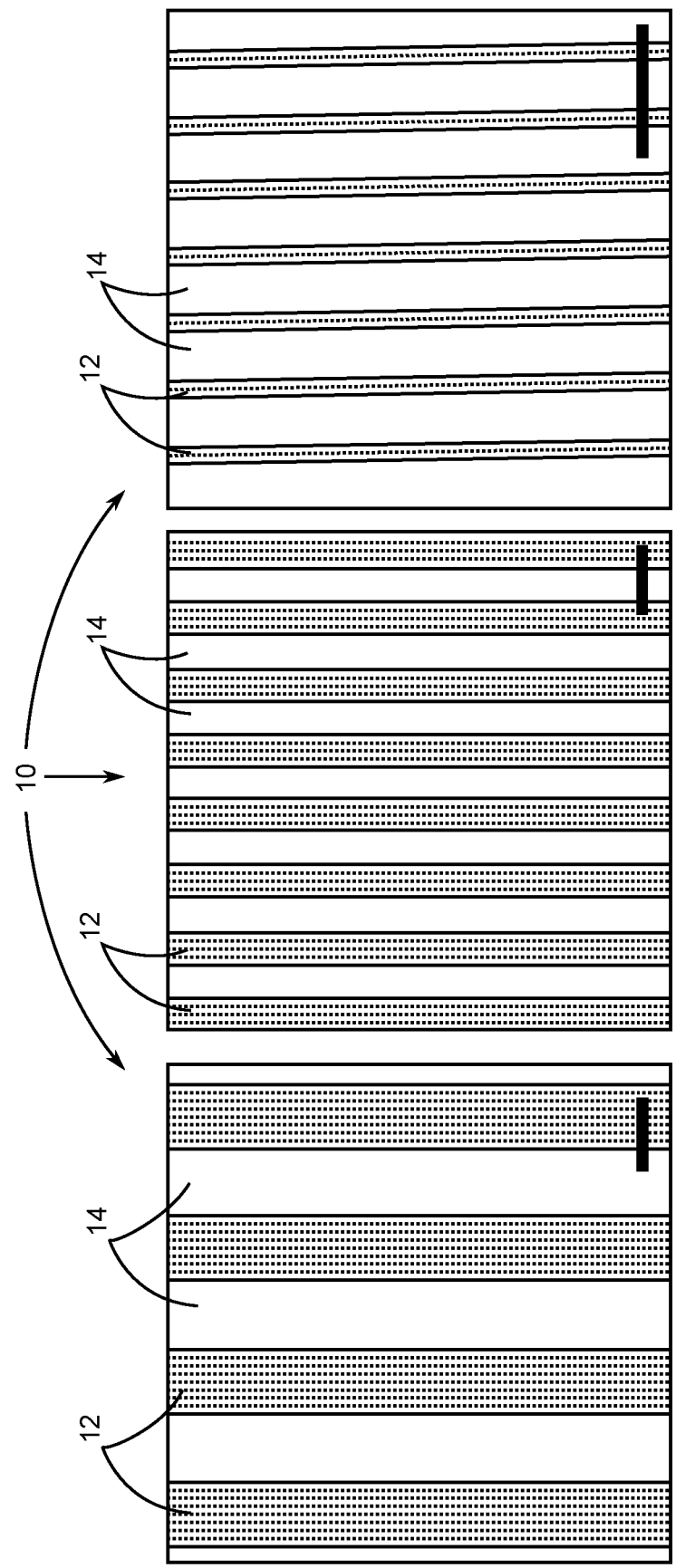

METHOD OF COATING AN OBJECT

RELATED APPLICATIONS

This application claims the benefit of provisional patent application Ser. No. 62/796,753, filed Jan. 25, 2019, the disclosure of which is hereby incorporated herein by reference in its entirety.

FIELD OF THE DISCLOSURE

The present disclosure relates generally to methods of thin-film processing used in fabricating advanced devices.

BACKGROUND

Thin-film patterning techniques enable a variety of advanced technological applications including integrated circuits, photonic devices, sensors, and tailorable adhesion. Many target structures require the sequential patterning of multiple layers that each includes different types of materials, for example, metals and dielectrics, which often impose stringent overlay demands that increase process complexity and cost. A concept known as self-aligned patterning can in principle ease these challenges by leveraging chemistry to selectively deposit material on certain regions of heterogeneous surfaces and not others. Typically, this is achieved by controlling the topography and/or surface chemistry of the underlying substrate. For example, area-selective atomic layer deposition can selectively form inorganic oxide films on metal/dielectric patterns by first preferentially modifying one substrate material with a self-assembled monolayer, which acts as a blocking or nucleation layer during subsequent growth. Polymeric thin films that similarly act as blocking layers or sacrificial masks can also be selectively formed on substrates already functionalized with chemical or topographic patterns that direct phase separation or dewetting processes. However, it may not always be convenient or even possible to preprocess or postprocess a substrate for self-aligned patterning, and a more general strategy without such constraints would be appealing. Thus, a technique for selectively coating objects made of heterogeneous materials is needed.

SUMMARY

Disclosed is a method of coating an object made of a first material and a second material that is different from the first material. The method includes dispensing a polymer solution onto the object, wherein the polymer solution has a property that wets one of the first material and the second material and dewets the other one of the first material and the second material.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 1A is a diagram of selective deposition in one spin-coating step in which semi-fluorinated polymers that are spin coated onto native copper/silicon dioxide ($Cu/SiO_2$) substrates selectively coat copper, with no pretreatment or posttreatment required.

FIG. 1B is a diagram showing that polymer design promotes preferential dewetting on homogeneous surfaces, which translates to selective deposition on heterogeneous patterns.

FIGS. 3A, 3B, and 3C show that D decreases with increasing spin speed, and isolated droplets start to coalesce at lower spin speeds, where D is the average droplet size formed by $8F_7$ when it dewets on homogeneous $SiO_2$.

FIG. 3A is a plot of D vs. spin speed from 4 krpm to 10 krpm.

FIGS. 3B and 3C are line drawings of optical images of dewetting on $SiO_2$ at 3 krpm and 2 krpm, respectively, showing that droplets are coalescing at lower spin speeds.

Figure 4A:
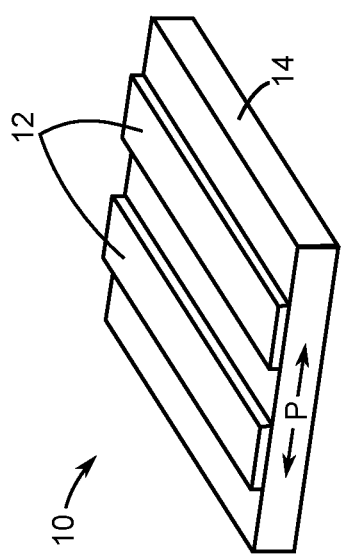

FIG. 4A is a diagram showing spin coating $8F_7$ on heterogeneous $Cu/SiO_2$ line-space patterns and showing the $Cu/SiO_2$ substrate dimensions, where P=pitch periodicity.

Figure 4B:
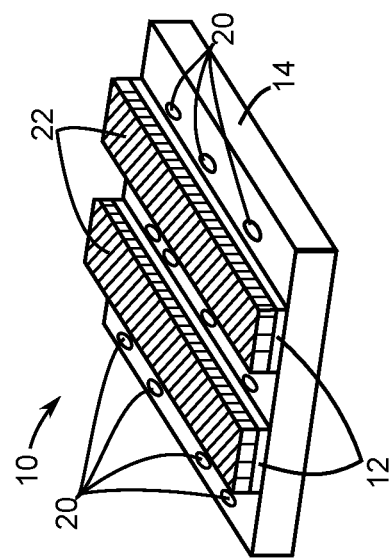

FIG. 4B is a diagram showing spin coating of $8F_7$ on heterogeneous $Cu/SiO_2$ line-space patterns and illustrating $8F_7$ deposition on $Cu/SiO_2$ when D/P<0.5.

Figure 4C:
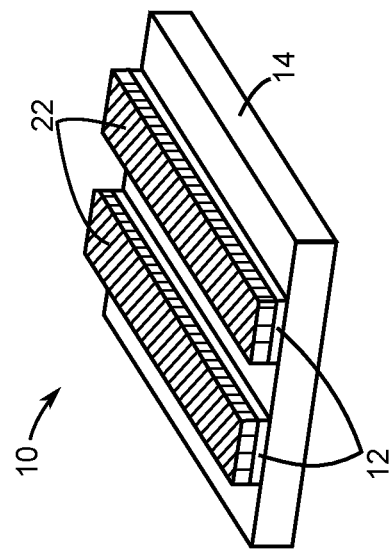
Figure 4D:
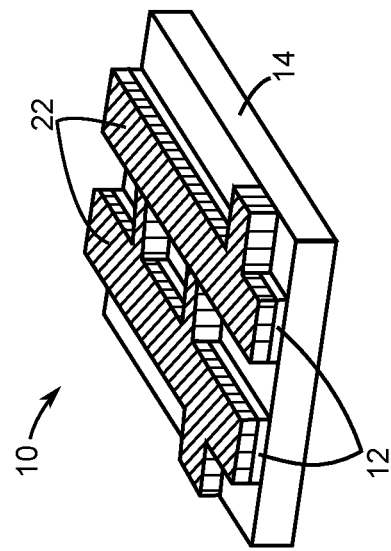

FIGS. 4C and 4D are diagrams showing spin coating of $8F_7$ on heterogeneous $Cu/SiO_2$ line-space patterns for D/P≈0.5 and D/P>0.5, respectively.

FIGS. 4E, 4F, and 4G are representative line drawings of optical images of $8F_7$ deposition on $Cu/SiO_2$ forming droplets, nothing, and bridges on $SiO_2$ when D/P=0.18, D/P=0.50, and D/P=0.62, respectively; coverage($SiO_2$)= 24%, 0%, and 8% for when D/P=0.18, D/P=0.50, and D/P=0.62, respectively, while coverage(Cu)=100% in all cases.

FIG. 4H is a diagram showing surface elemental mapping before, with conditions corresponding to FIG. 4F.

FIG. 4I is a diagram showing surface elemental mapping after spin coating, with conditions corresponding to FIG. 4F showing that the polymer is only coating copper.

Figure 5A:
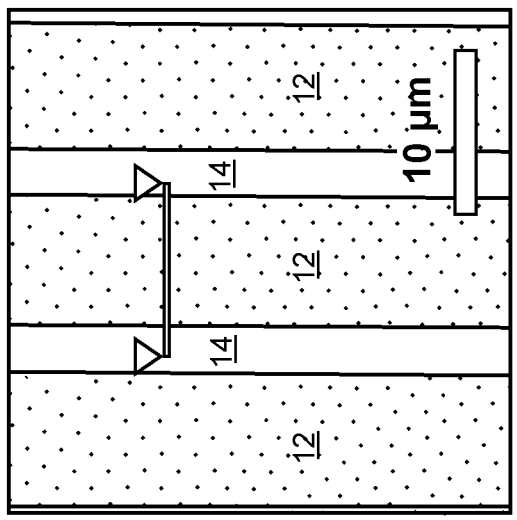
Figure 5B:
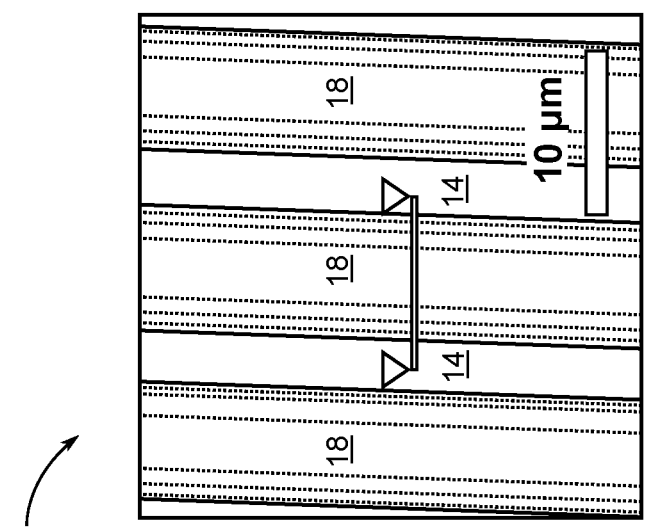

FIGS. 5A and 5B are atomic force microscopy images showing that $8F_7$ selectively coats copper and forms a symmetric film: $Cu/SiO_2$ line pattern before and after spin coating, respectively.

Figure 5C:
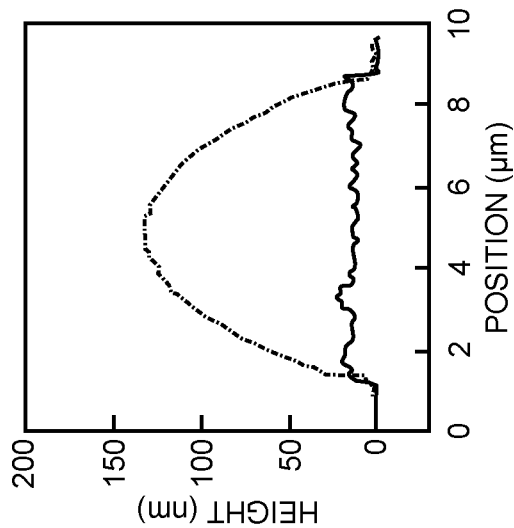

FIG. 5C is a graph showing height profiles of the line cut in FIG. 5A and FIG. 5B, showing that film thickness in the middle is 130−15=115 nm.

FIGS. 6A, 6B, and 6C are plots showing that $8F_7$ coverage on copper and $SiO_2$ as a function of the casting solution concentration is distinct for P=40 μm, P=20 μm, and P=10 μm, respectively.

Figure 6D:
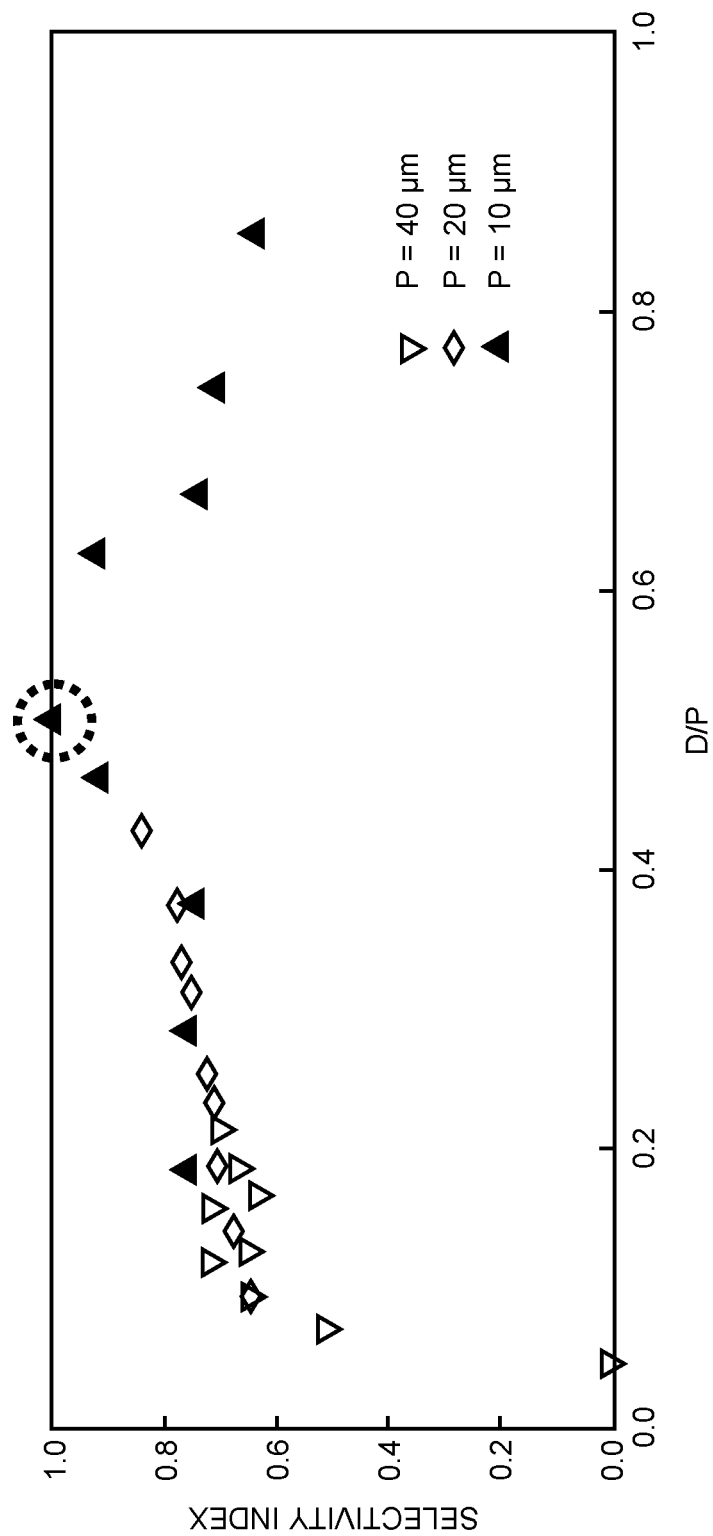

FIG. 6D is a plot showing that the selectivity index is optimized when D/P≈0.5.

FIGS. 7A and 7B are atomic force microscopy images showing that the copper line thickness is about 15 nm in the $Cu/SiO_2$ line pattern P=40 μm and P=20 μm, respectively.

FIG. 7C and 7D are height profiles of the line cut in FIGS. 7A and 7B, respectively.

Figure 8B:
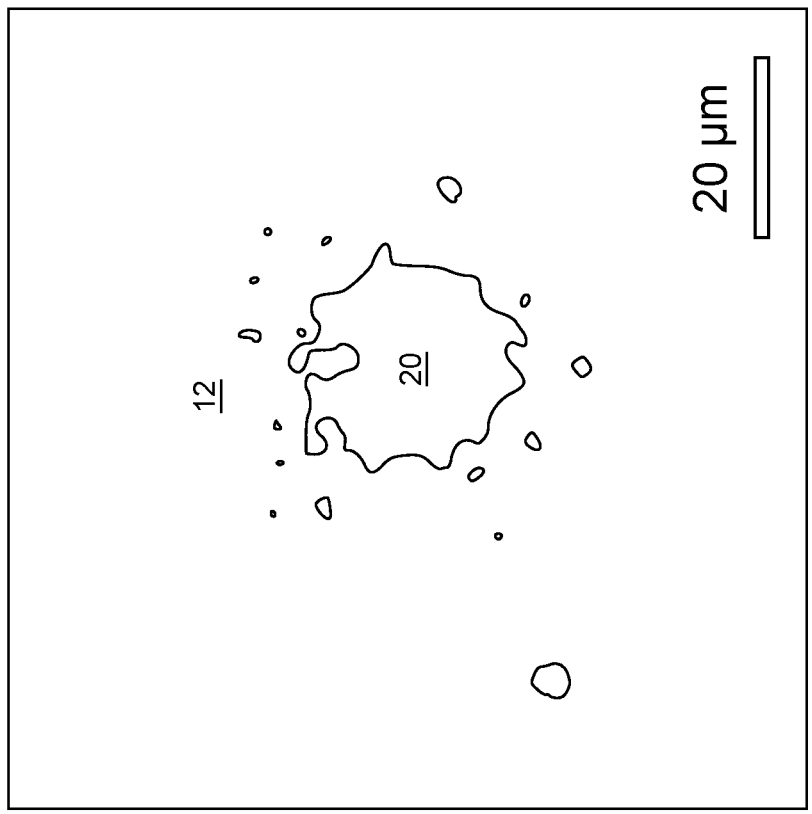
Figure 8A:
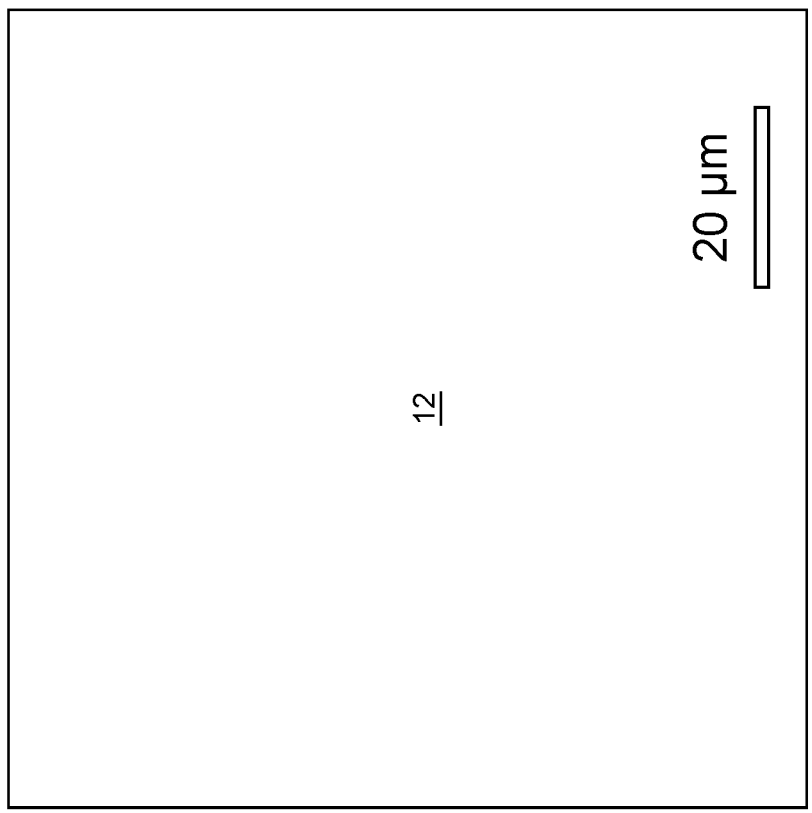

FIGS. 8A and 8B are line drawings of optical images showing that $8F_7$ slightly dewets copper under some spin coating conditions: a native copper substrate and dewetting of $8F_7$ on copper, respectively, for which spin coating conditions are as follows: $8F_7$ in trifluoroethanol, 10 krpm, 1.5 wt %.

Figure 9A:
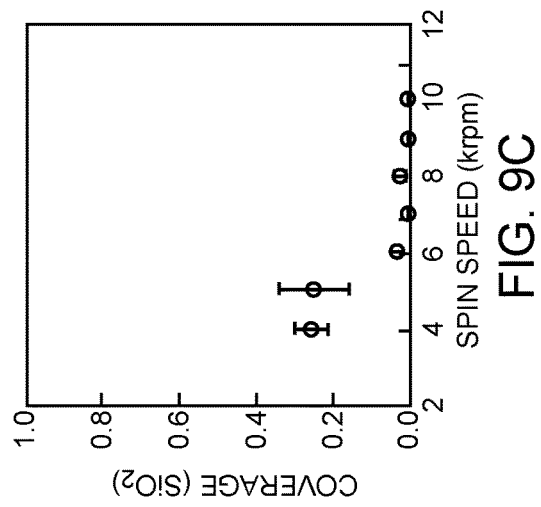
Figure 9B:
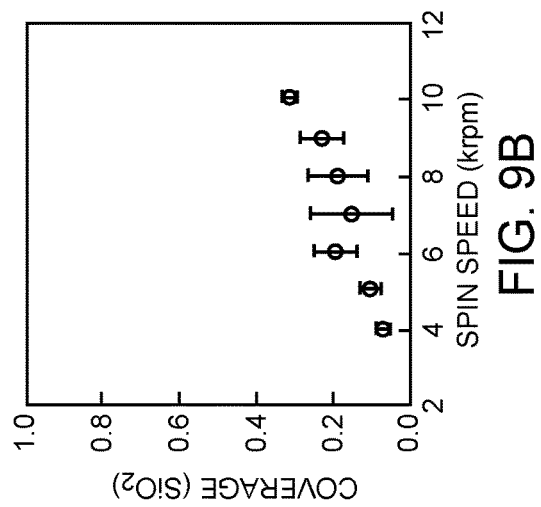
Figure 9C:
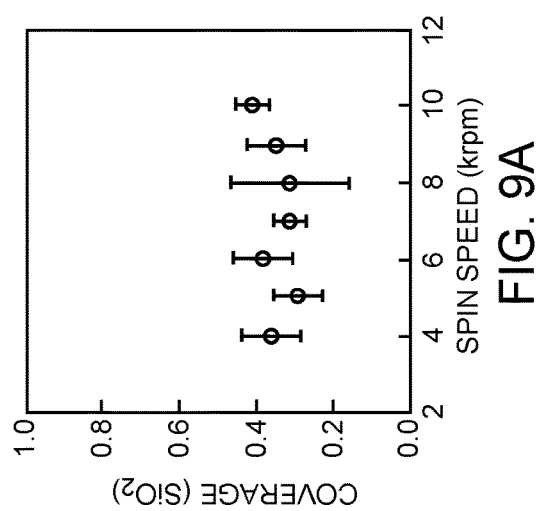

FIGS. 9A, 9B, and 9C are plots showing that spin speed studies reveal the same unified relationship as concentration studies, where $8F_7$ coverage on copper is 100% in all cases, but $8F_7$ coverage on $SiO_2$ as a function of the spin speed is distinct for P=40 µm, P=20 µm, and P=10 µm, respectively.

Figure 9D:
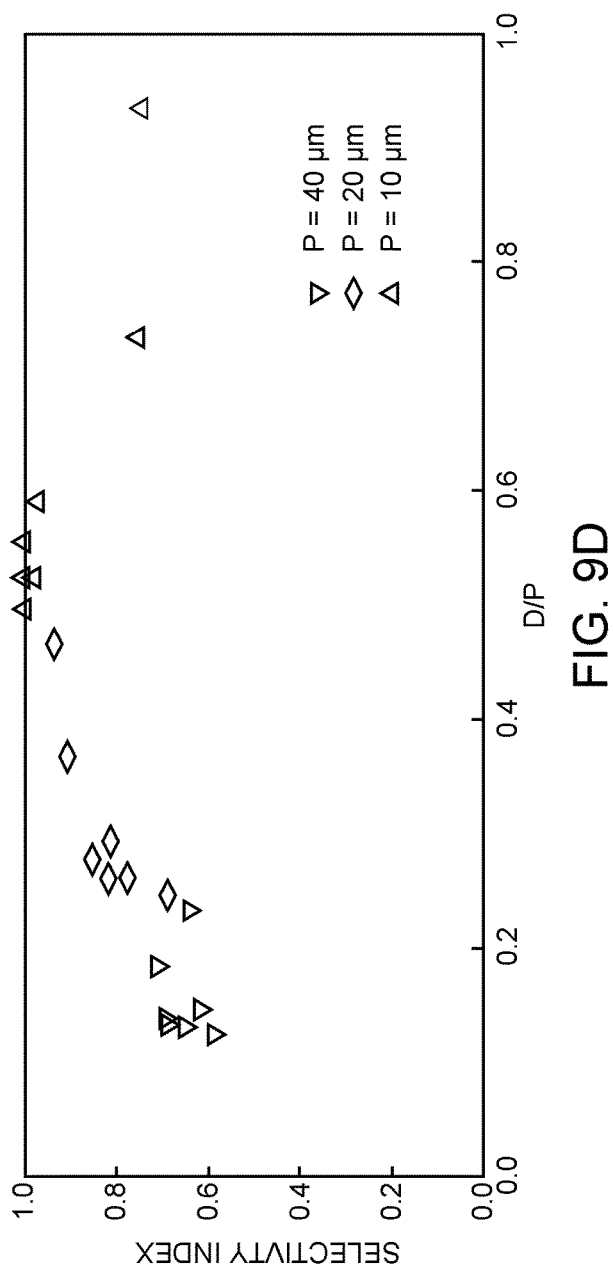

FIG. 9D is a plot showing that the selectivity index as a function of D/P suggests that the best selectivity occurs when D/P≈0.5.

Figure 10A:
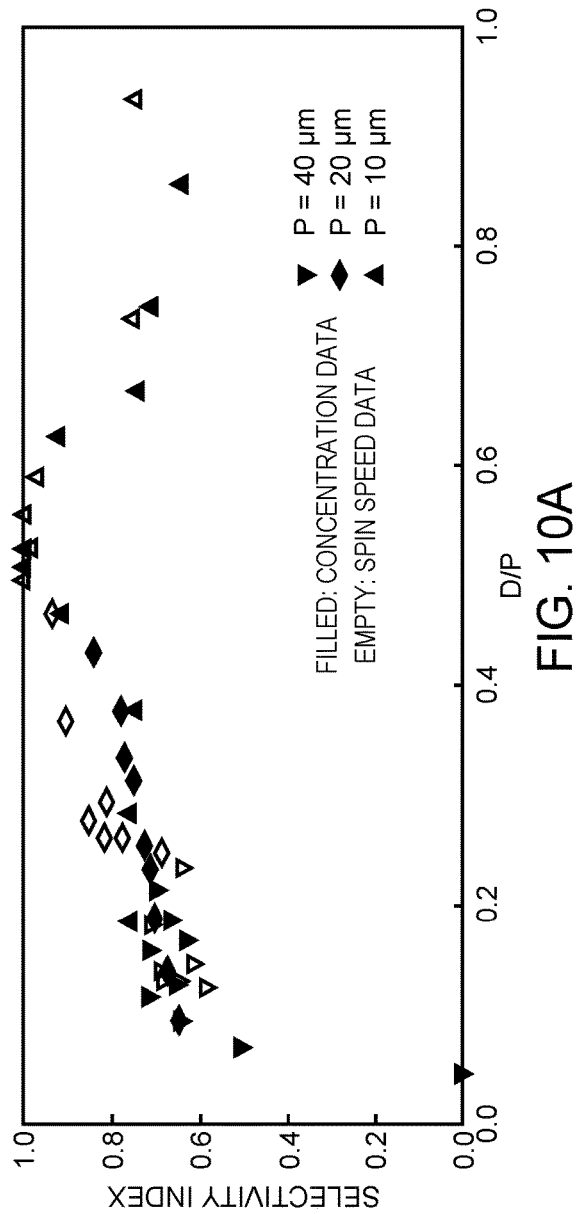
Figure 10B:
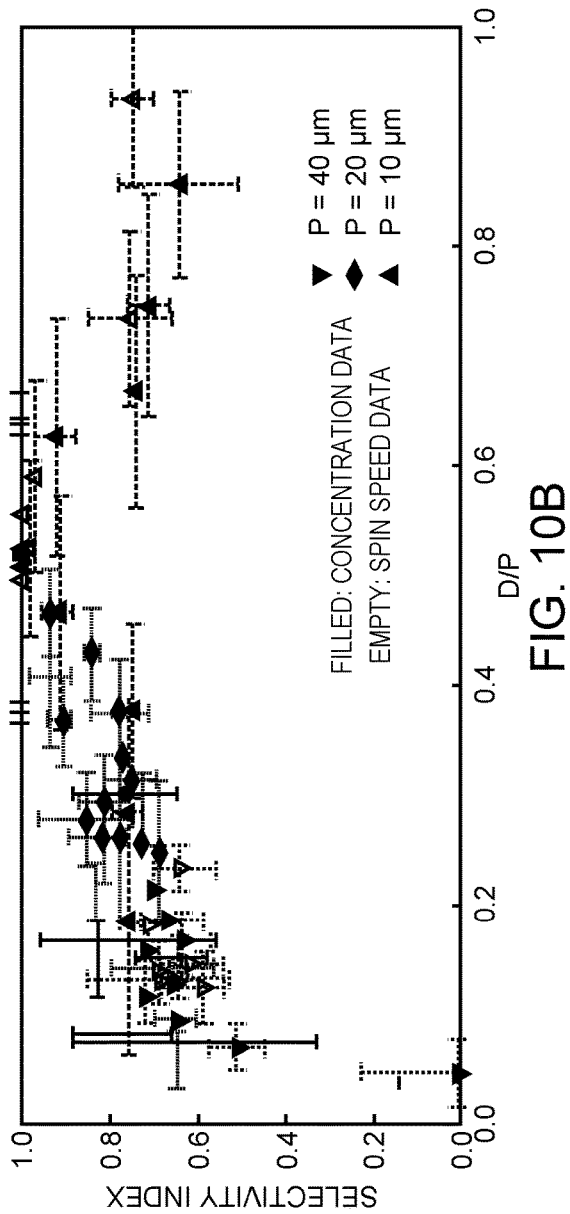

FIGS. 10A and 10B are plots showing that concentration and spin speed studies coalesce to a unified relationship.

FIG. 11A is a diagram showing that D decreases with increasing molecular weight; at lower concentrations, the difference between $8F_7$, $8F_{15}$ (poly(1H,1H,5H-octafluoropentyl acrylate), degree of polymerization=15), and $8F_{30}$ (poly(1H,1H,5H-octafluoropentyl acrylate), degree of polymerization=30) is smaller.

FIGS. 11B, 11C, and 11D are representative line draw drawings of optical images of droplets of $8F_7$, $8F_{15}$, and $8F_{30}$, respectively.

FIGS. 12A to 12I are chemical structures and line drawings of optical images of $3F_7$ (poly(2,2,2-trifluoroethyl acrylate), degree of polymerization=7), $4F_7$ (poly(2,2,3,3-tetrafluoropropyl acrylate), degree of polymerization=7), and $8F_{15}$ that all wet homogenous copper and dewet homogeneous $SiO_2$.

FIGS. 12A, 12D, and 12G show the chemical structure of $3F_7$, $4F_7$, and $8F_{15}$, respectively.

FIGS. 12B, 12E, are 12H are line drawings of optical images of $3F_7$, $4F_7$, and $8F_{15}$ wetting copper.

FIGS. 12C, 12F, and 12I are line drawings of optical images of $3F_7$, $4F_7$, and $8F_{15}$ dewetting $SiO_2$.

FIGS. 13A to 13F show that the selectivity rules are readily applicable to other semi-fluorinated polymers with different molecular weights and monomer structures.

Figure 13C:
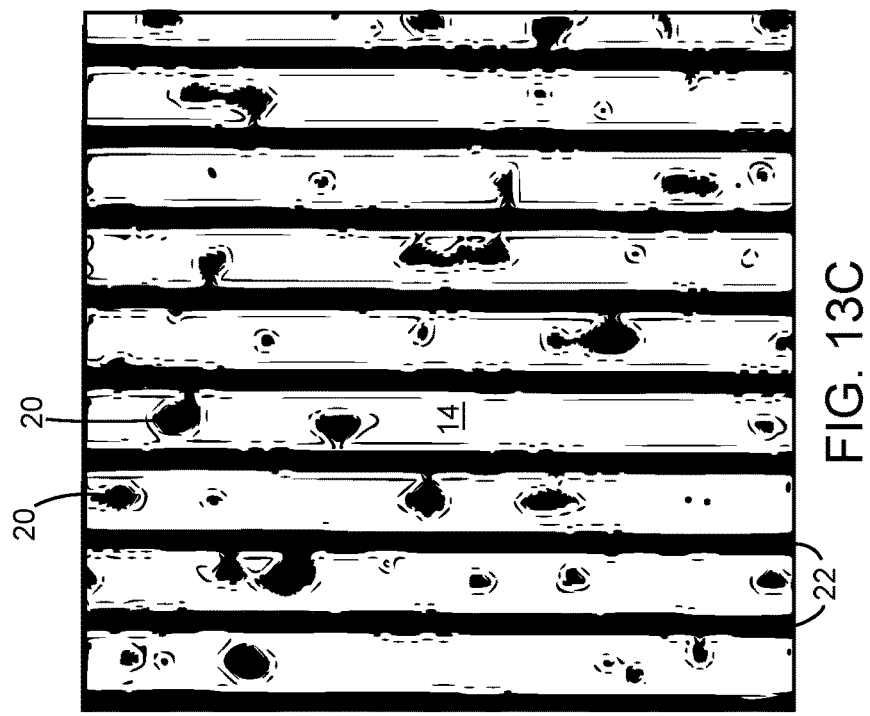
Figure 13B:
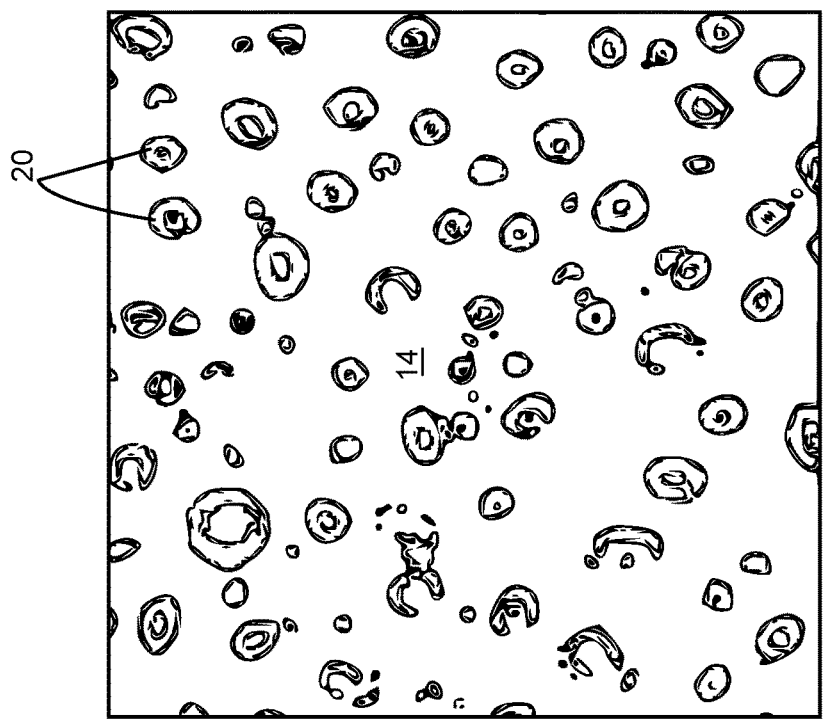
Figure 13A:
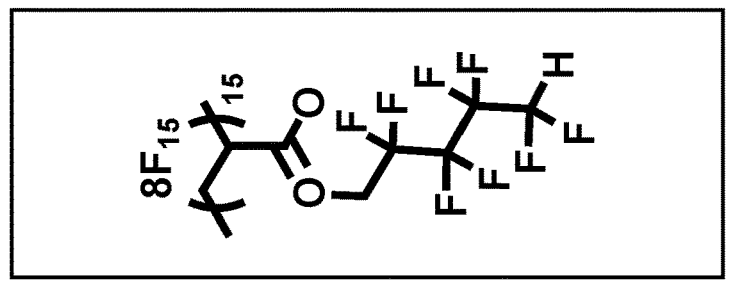
Figure 13F:
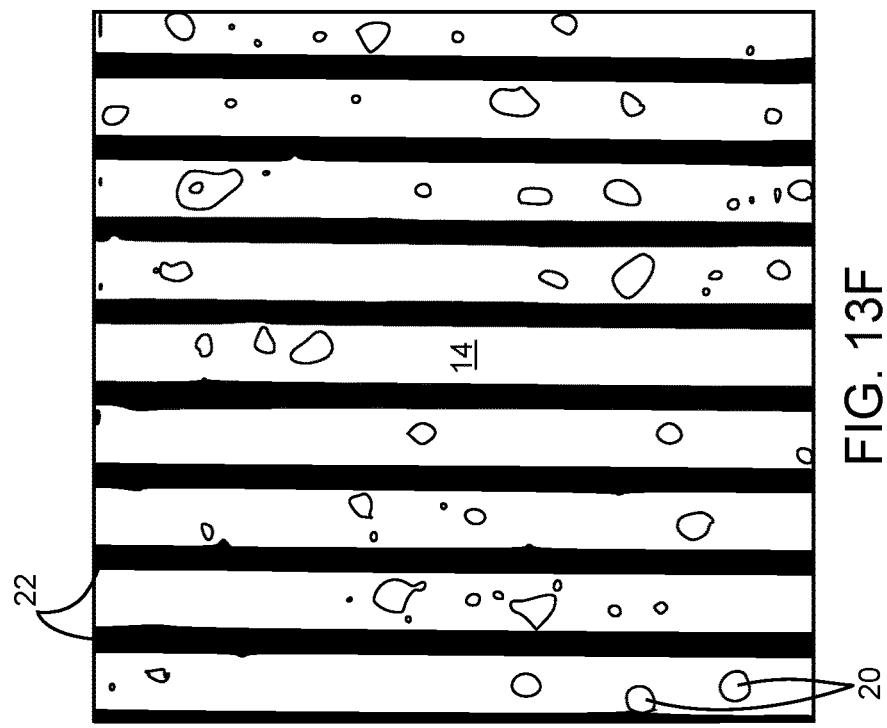
Figure 13E:
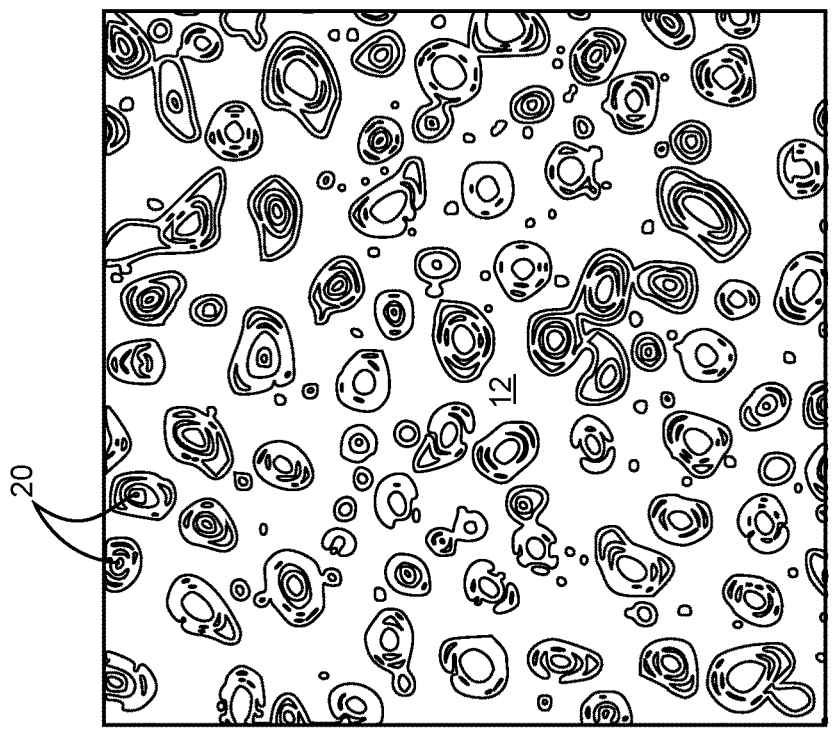
Figure 13D:
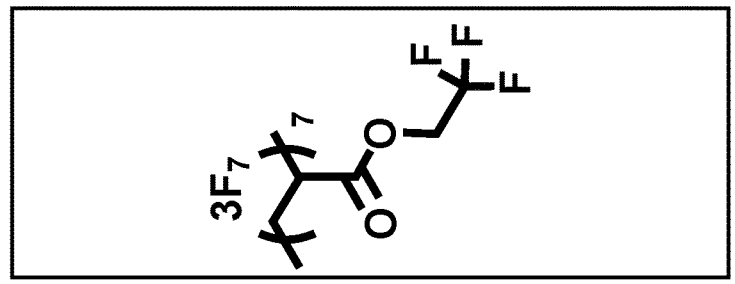

FIGS. 13A and 13D are chemical structures of $8F_{15}$ and $3F_7$, respectively.

FIGS. 13B and 13C are line drawings of optical images showing that when D/P≈0.5 (FIG. 13B), selectivity is achieved for $8F_{15}$ (FIG. 13C).

FIGS. 13E and 13F are line drawings of optical images showing that when D/P≈0.5 (FIG. 13E), selectivity is achieved for $3F_7$ (FIG. 13F).

FIGS. 14A to 14F show that $13F_7$ (poly(1H,1H,2H,2H-perfluorooctyl acrylate), degree of polymerization=7) dewets both homogeneous copper and homogeneous $SiO_2$, so it is not suitable for selective deposition on $Cu/SiO_2$.

Figure 14C:
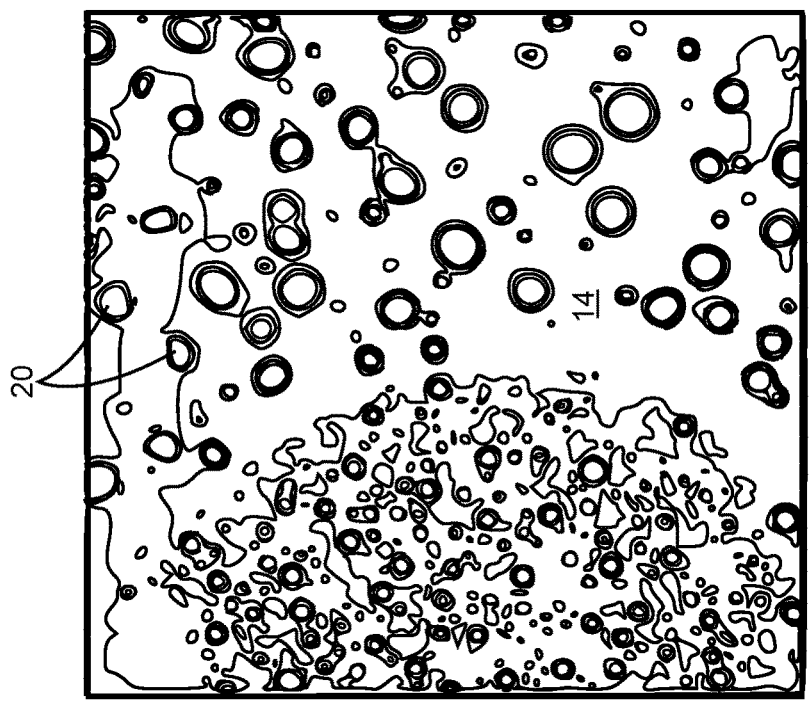
Figure 14B:
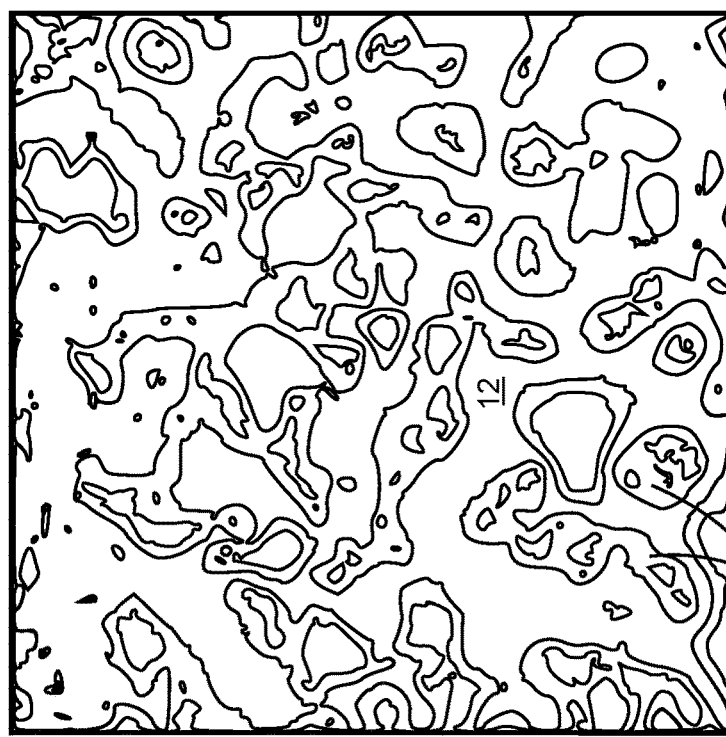
Figure 14A:
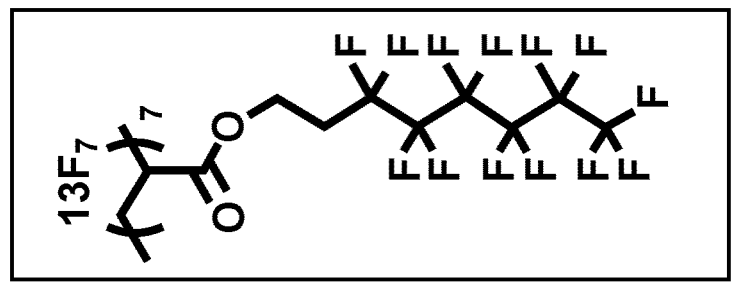

FIG. 14A is the chemical structure of $13F_7$.

FIGS. 14B and 14C are representative line drawings of optical images of $13F_7$ dewetting copper and $SiO_2$, respectively.

FIGS. 14D, 14E, and 14F are representative line drawings of optical images of $13F_7$ on $Cu/SiO_2$ when P=40 µm, P=20 µm, and P=10 µm, respectively.

FIGS. 15A to 15F show that selective deposition was not obtained for non-fluorinated methyl acrylate oligomers.

Figure 15C:
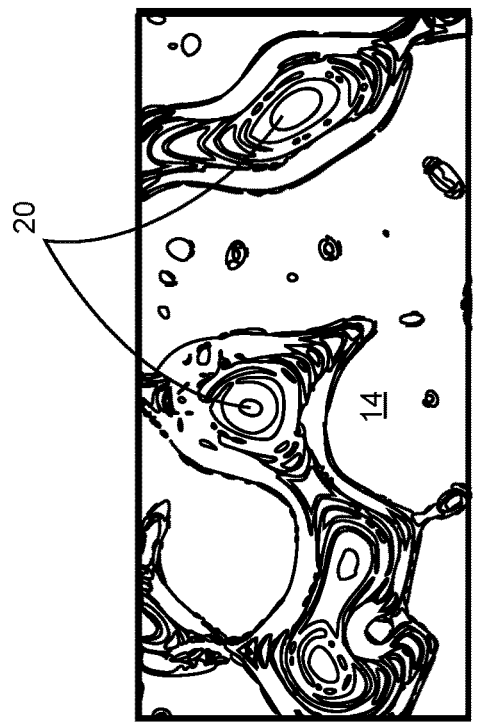
Figure 15B:
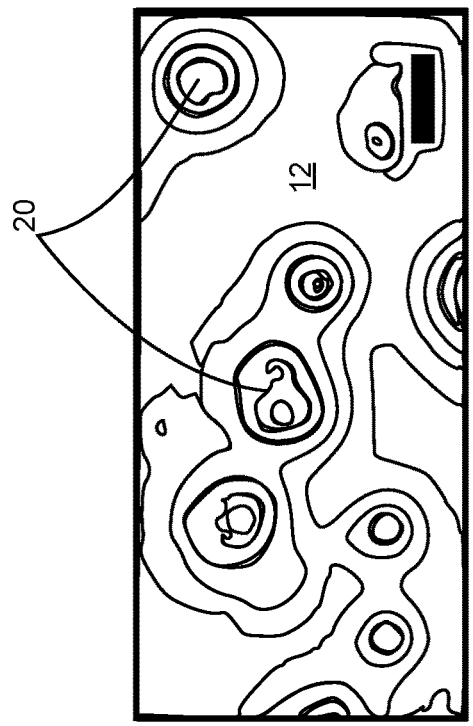
Figure 15A:
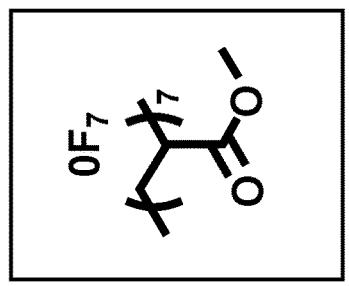

FIG. 15A is the chemical structure of $0F_7$ (poly(methyl acrylate), degree of polymerization=7).

FIGS. 15B and 15C are representative line drawings of optical images of $0F_7$ dewetting copper and $SiO_2$, respectively, when cast from trifluoroethanol.

Figure 15F:
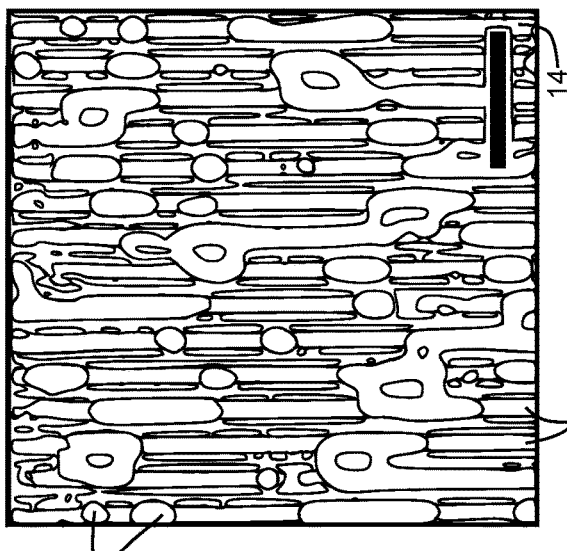
Figure 15E:
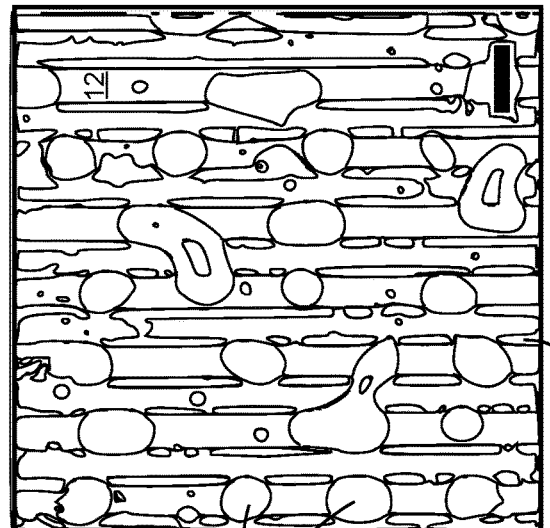
Figure 15D:
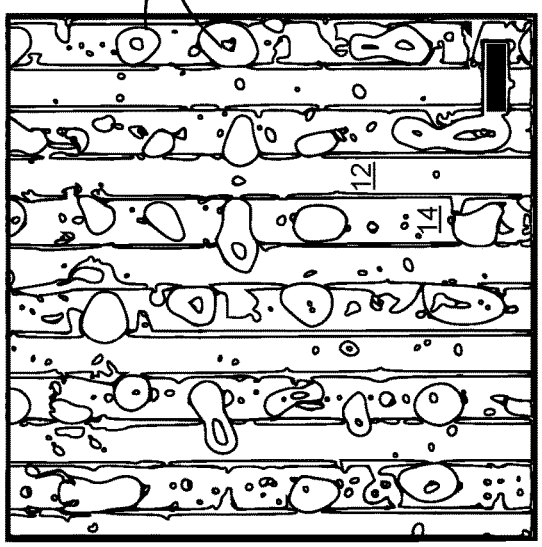

FIGS. 15D, 15E, and 15F are representative line drawings of optical images of $0F_7$ on $Cu/SiO_2$ when P=40 µm, P=20 µm, and P=10 µm, respectively, when cast from trifluoroethanol.

Figure 16B:
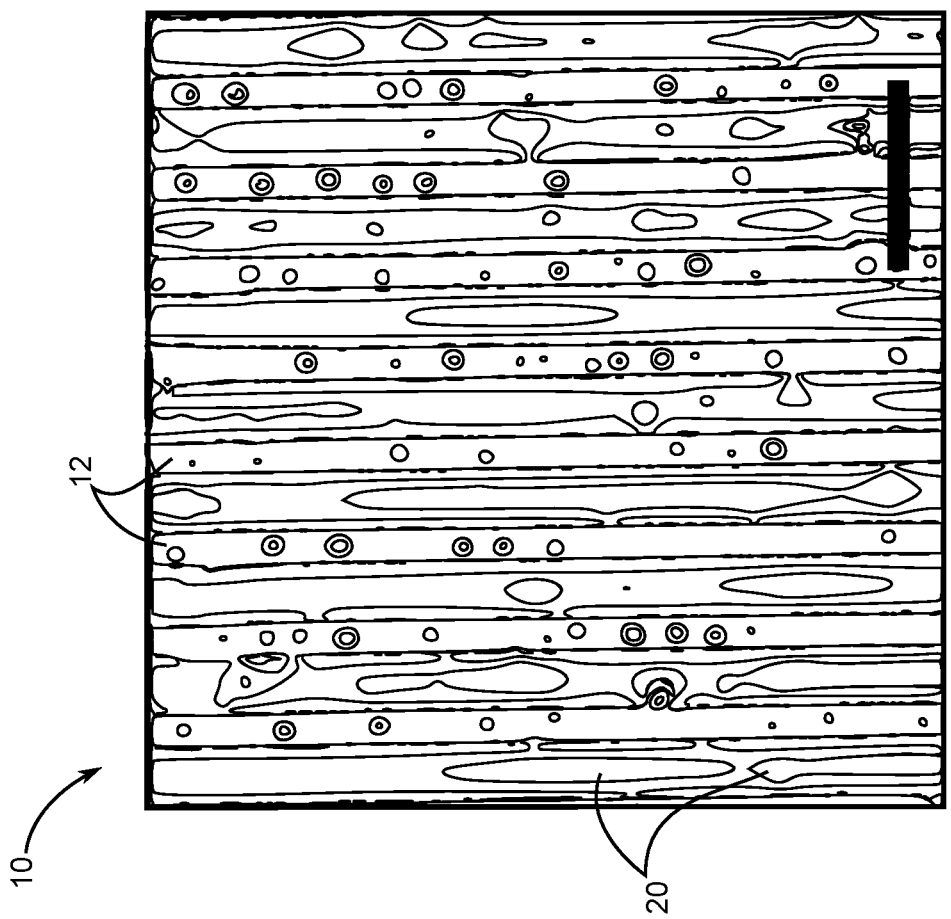
Figure 16A:
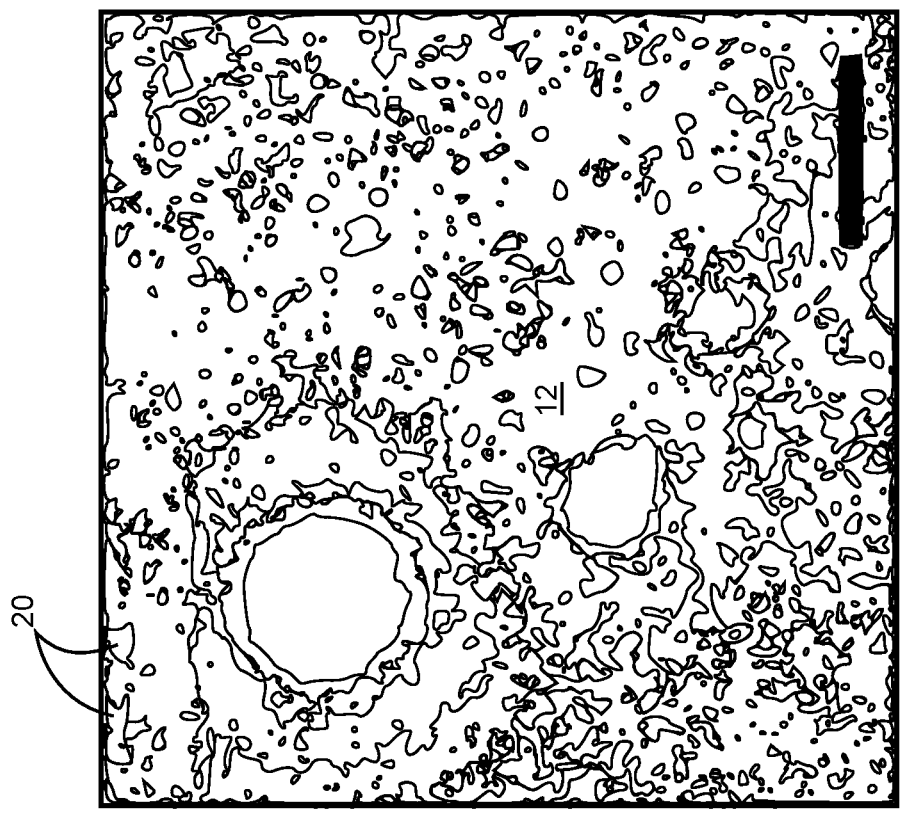

FIGS. 16A and 16B are images showing hole formation on homogenous copper observed under some spin coating conditions (FIG. 16A) where copper coverage is 100% on patterns (FIG. 16B).

FIGS. 17A, 17B, and 17C are line drawings of optical images showing that while the lines and spaces of 20 µm and 40 µm full-pitch patterns are approximately equal in width, the 10 µm pattern has significantly wider copper lines than $SiO_2$ gaps as shown by line drawings of optical images of native substrates of P=40 µm, P=20 µm, and P=10 µm, respectively; all the scale bars are 20 µm.

Figure 18A:
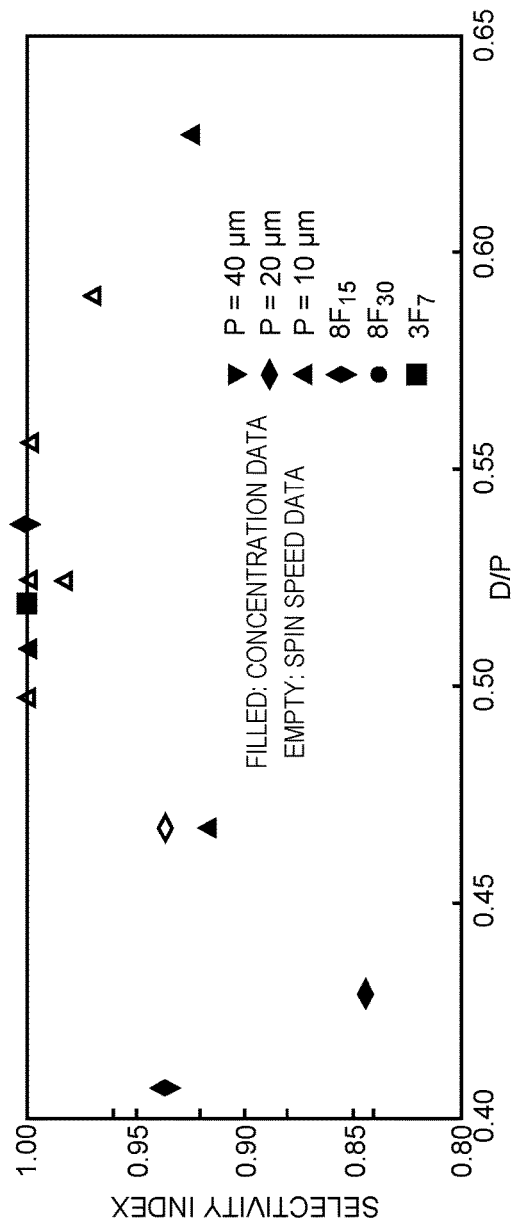
Figure 18B:
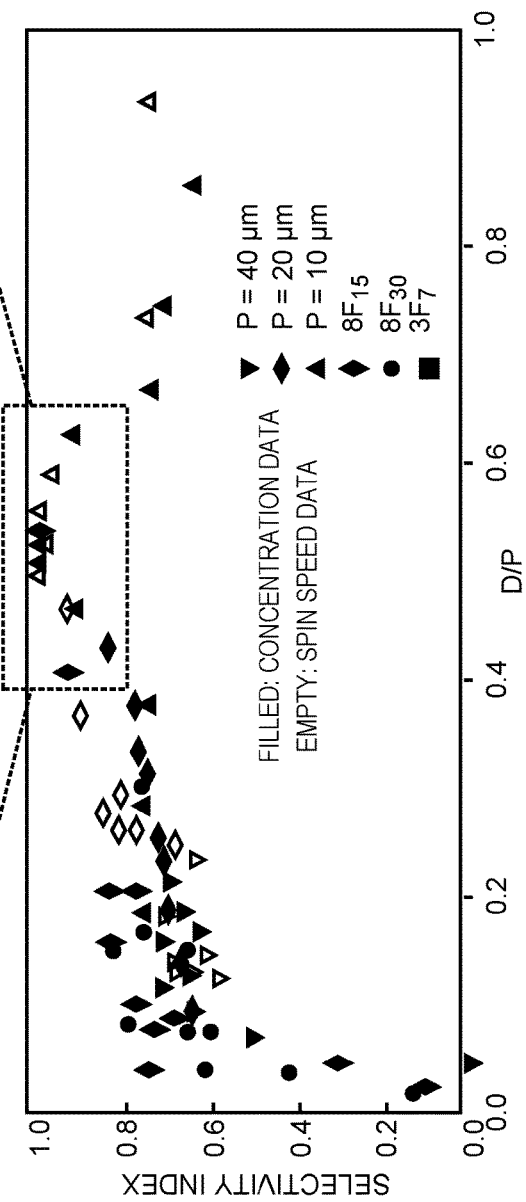
Figure 18C:
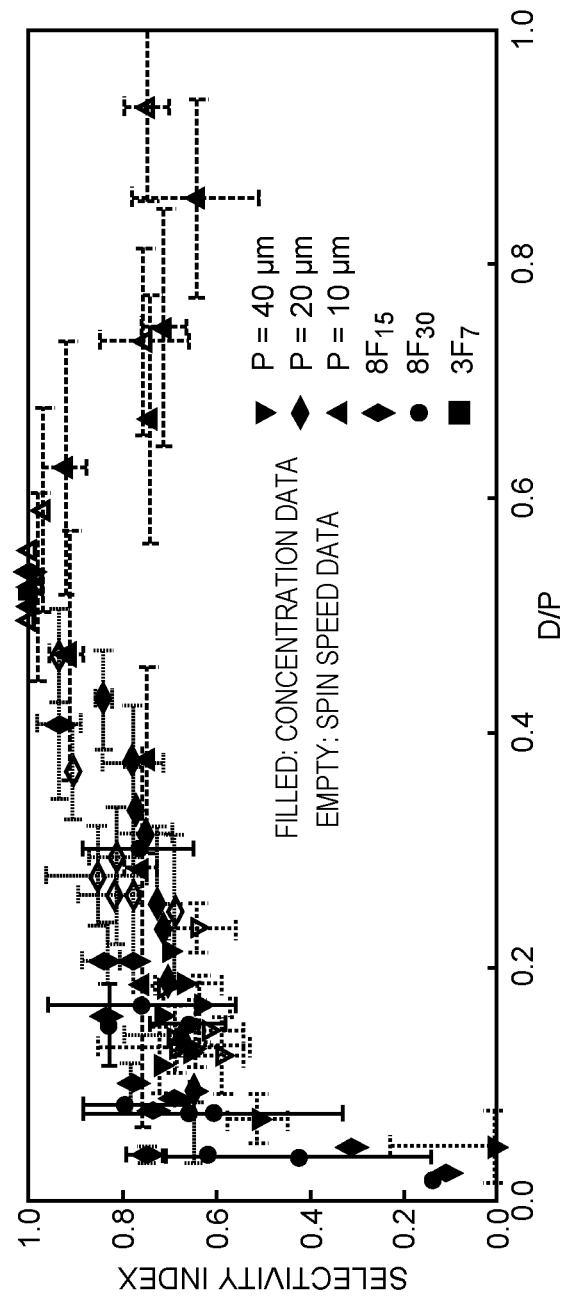

FIGS. 18A, 18B, and 18C are comprehensive plots of selectivity index vs. D/P summarizing all the studies of the present disclosure and suggesting that D/P does not have to be precisely 0.5 to obtain good selectivity;

some deviation is permitted.

FIG. 18A is a zoomed-in view of the plot when 0.40<D/P<0.65.

FIGS. 18B and 18C show the complete plot without and with error bars, respectively.

Figure 19C:
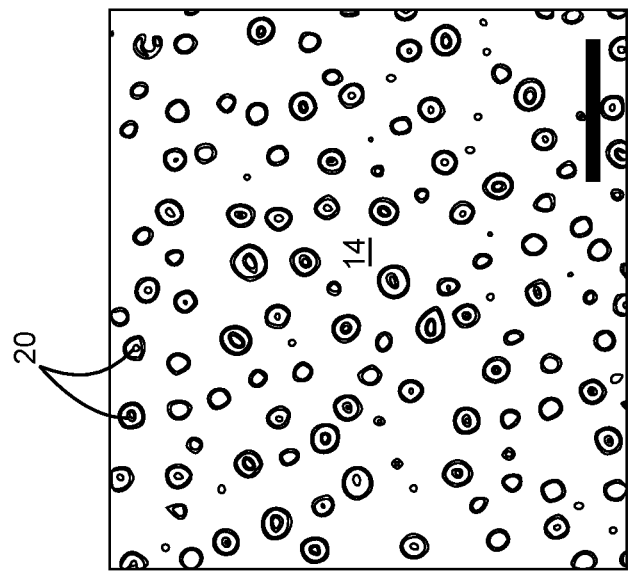
Figure 19B:
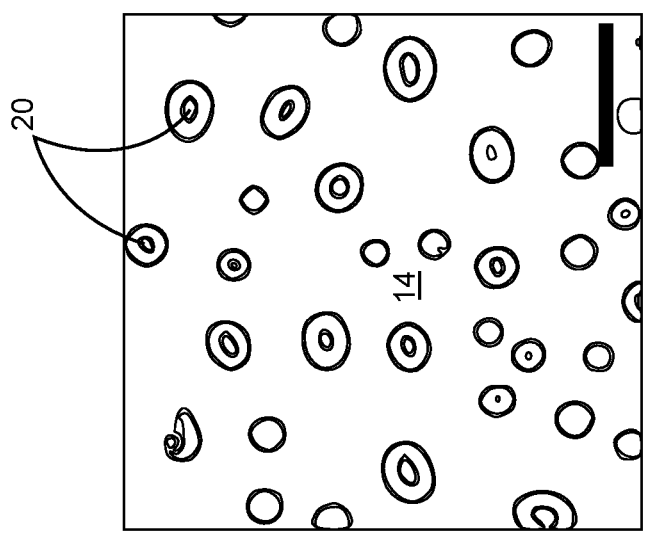
Figure 19A:
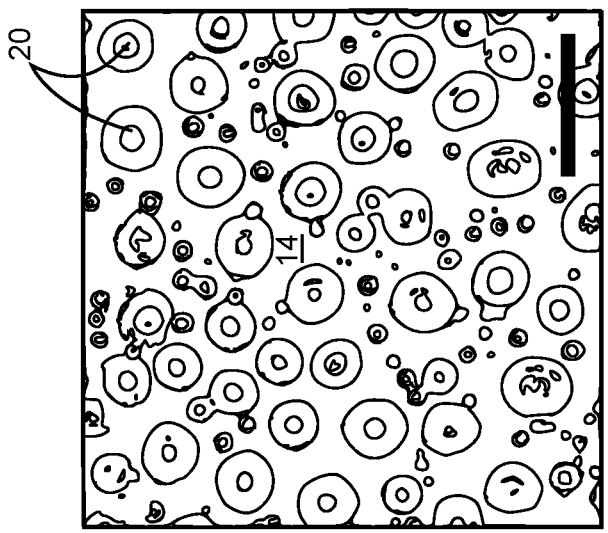

FIGS. 19A, 19B, and 19C are line drawings of optical images showing that $8F_{15}$ dewetting size also decreases with increasing spin speed: representative line drawings of optical images of $8F_{15}$ dewetting at 2 krpm, 5 krpm, and 10 krpm, respectively, are shown.

Figure 20C:
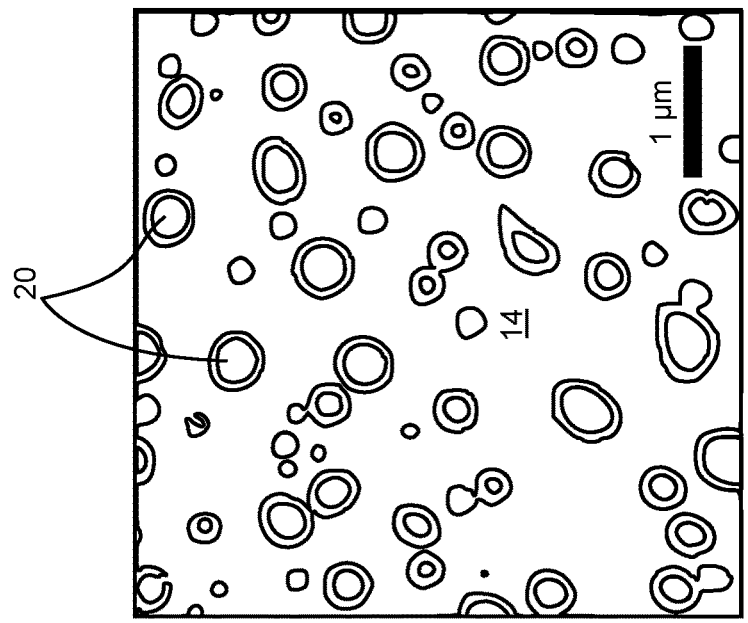
Figure 20B:
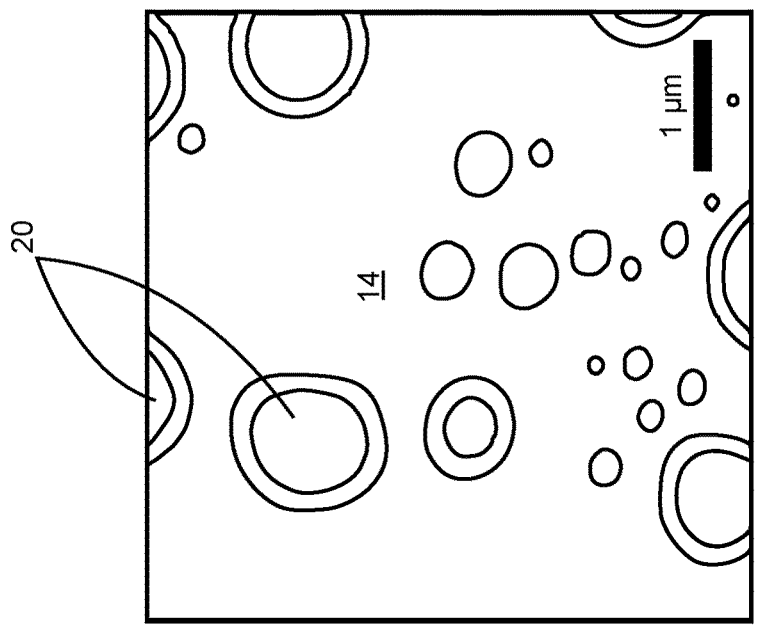
Figure 20A:
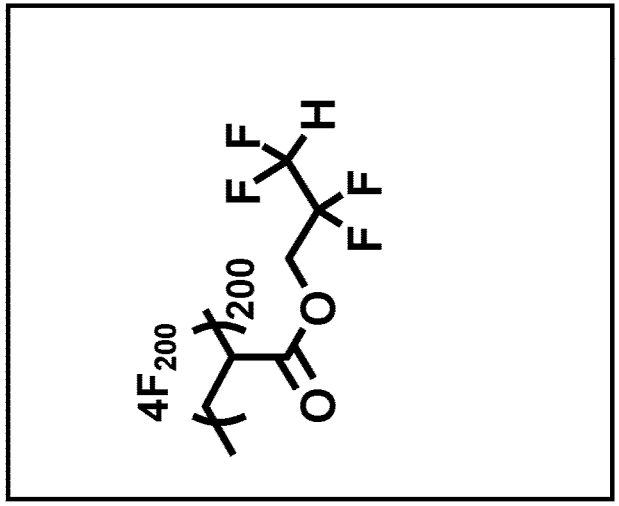

FIG. 20A is the molecular structure of $4F_{200}$ (poly(2,2,3,3-tetrafluoropropyl acrylate), degree of polymerization=200), which forms nanoscale droplets.

FIGS. 20B and 20C are atomic force microscopy images of $4F_{200}$ dewetting on $SiO_2$ at 1.0 wt % and 0.2 wt %, respectively; the droplet size is about 470 nm and 230 nm, respectively.

Figure 21:
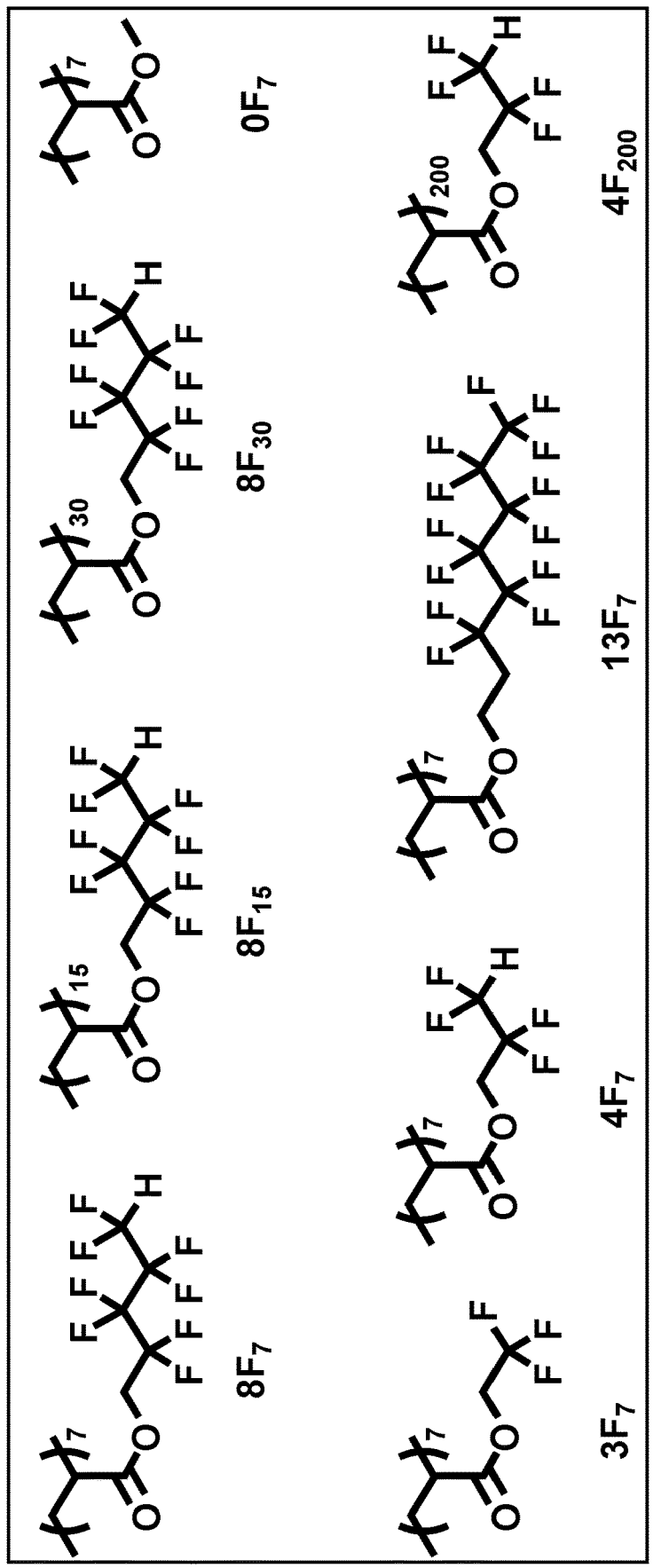

FIG. 21 shows the chemical structures of all the oligomers presented in the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Disclosed is a method for selective deposition of polymeric coatings on heterogeneous substrates (copper/silicon dioxide [Cu/SiO$_2$]) using spin coating.

Selectivity is induced by polymer design that promotes preferential dewetting from one substrate material and uniform wetting on the other. Polyacrylates containing semi-fluorinated pendant groups satisfy this criterion and spontaneously dewet from SiO$_2$ but form continuous films on copper. When spin coated onto Cu/SiO$_2$ line-space patterns, these semi-fluorinated polymers selectively coat copper without any preprocessing or postprocessing. Design rules anticipate regimes of selective deposition that connect the droplet size of dewetting structures on homogeneous SiO$_2$ with the dimensions of heterogeneous Cu/SiO$_2$ patterns and have been demonstrated across a variety of polymers with varying molecular weight and monomer structure. The power of this technique lies in the simplicity and rapidity of spin coating; the entire patterning process involves one step and is complete in under 1 minute.

In particular, the present disclosure demonstrates spin dewetting, which spontaneously forms patterned polymeric thin films on heterogeneous surfaces during spin coating and which can be achieved without substrate pretreatment or posttreatment by appropriately tailoring polymer chemistry. FIG. 1A depicts providing an object 10 made of a first material 12 and a second material 14. In this exemplary embodiment, the first material 12 is copper and the second material 14 is SiO$_2$. Using as-fabricated line-space patterns of copper and SiO$_2$ as a model system, a polymer solution 16, which in this exemplary case includes semi-fluorinated poly(acrylates), is selectively deposited in under 1 minute without any chemical modification of the underlying substrate that in this case is made of the second material 14. A uniform coating 18 of the semi-fluorinated poly(acrylates) remains only on the first material 12 after spin coating the object 10 with the polymer solution 16. Selectivity on the surfaces of these heterogeneous materials is correlated with preferential dewetting behavior on homogeneous copper and SiO$_2$ surfaces, as shown in FIG. 1B. In the exemplary method of FIG. 1B, a molecular design (step 100) is provided to select an appropriate polymer for polymer solution 16. Next, selective dewetting produces dewetted droplets 20 along with a wetted coating 22 over the first material 12 (step 102). Solvent 24 evaporates to leave the uniform coating 18 to complete selective deposition (step 104). The elucidation of universal design rules further provides predictive control over selective spin dewetting regimes on heterogeneous surfaces across a variety of monomer structures and polymer molecular weights.

Figure 2A:
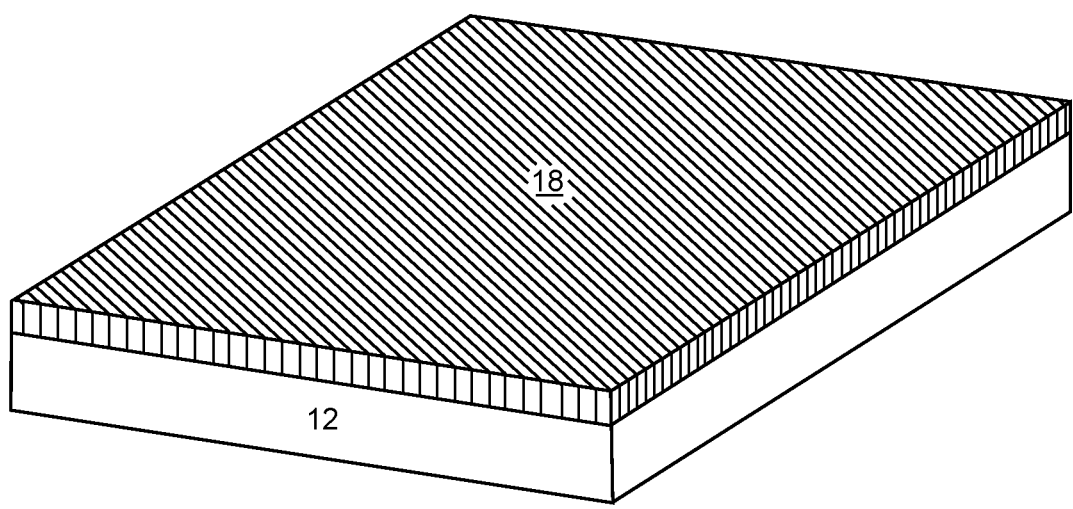
FIG. 2A is a diagram showing spin coating of $8F_7$ (poly(1H,1H,5H-octafluoropentyl acrylate), degree of polymerization=7) on a homogeneous Cu substrate, which forms a continuous film.
Figure 2B:
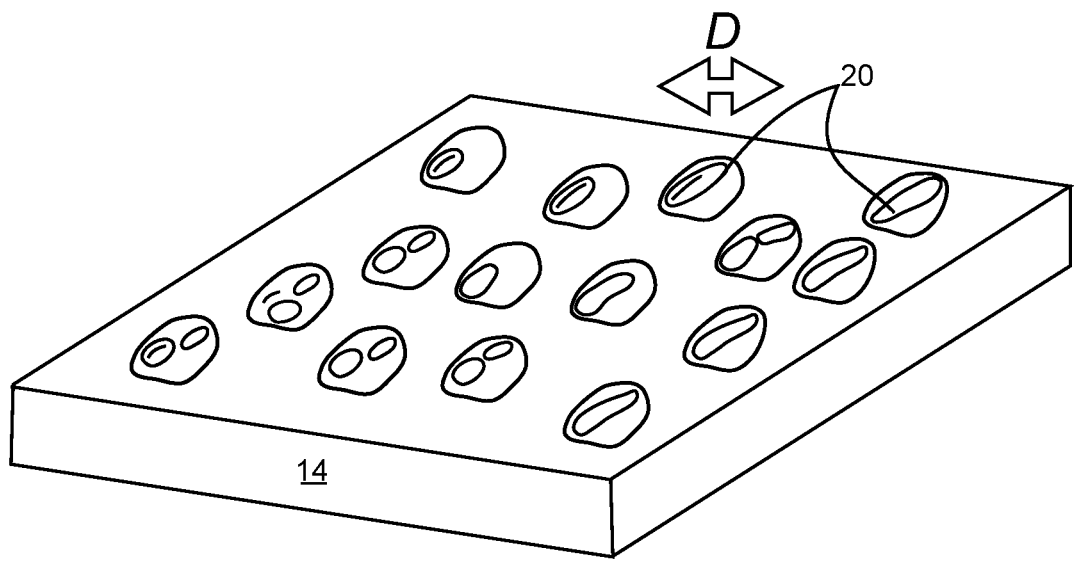
FIG. 2B is a diagram showing spin coating of $8F_7$ on an $SiO_2$ homogeneous substrate, which forms dewetted droplets.
Figure 2C:
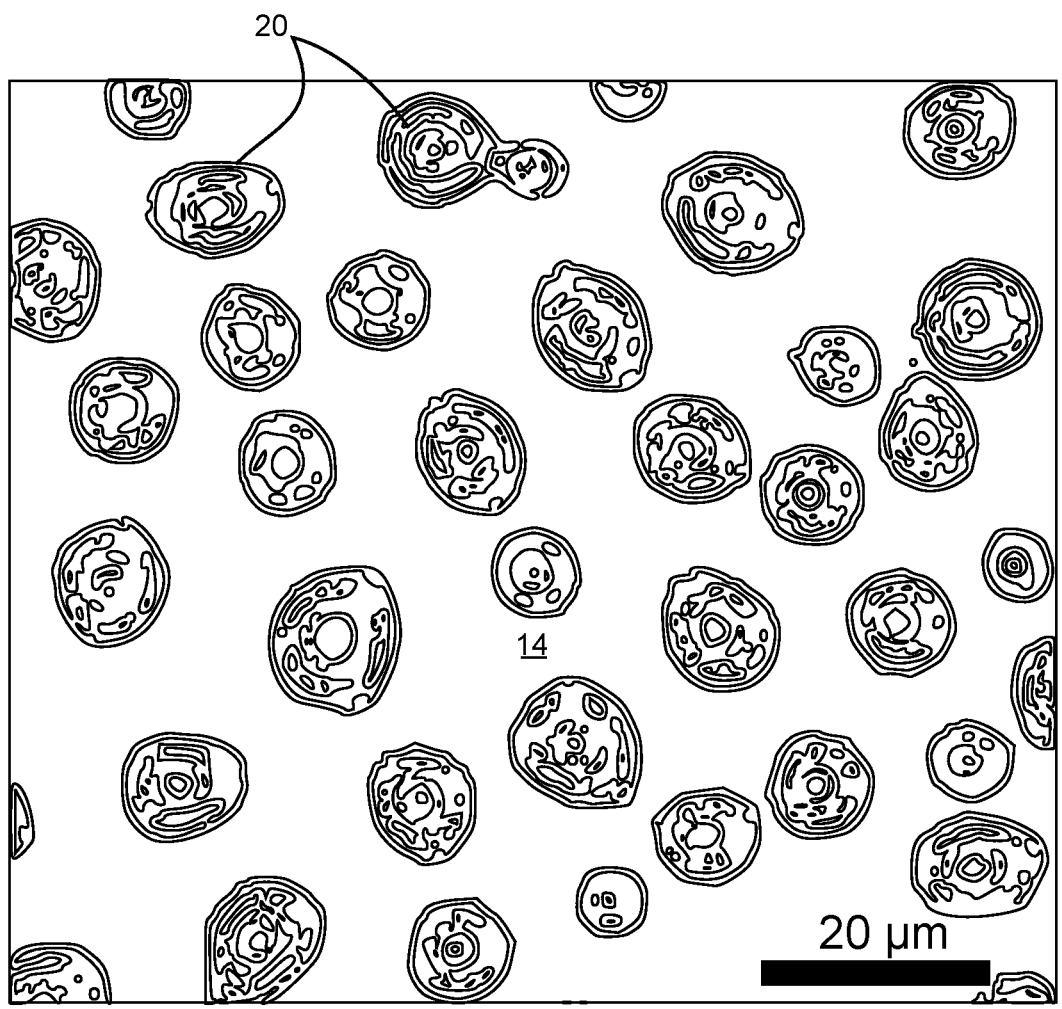
FIG. 2C is a top view of dewetted droplets on $SiO_2$.

Past studies have highlighted the speed and simplicity of spin dewetting by using self-assembled monolayers (SAMs) to cause preferential dewetting from one heterogeneous substrate material. The reasoning for the present disclosure is that perhaps this selective dewetting can instead be achieved via polymer design. Semi-fluorinated poly(acrylates) were selected as a model platform since (1) they are synthetically accessible with low molar mass dispersities and (2) fluorine is known to exhibit unique thin film wetting characteristics. Initial experiments focused on poly(2,2,3,3,4,4,5,5-octafluoropentyl acrylate) oligomers (or poly(1H,1H,5H-octafluoropentyl acrylate)), which have eight fluorine atoms per repeat unit and a degree of polymerization n=7 (denoted as 8F$_7$). Spin coating 8F$_7$ onto native, homogeneous surfaces results in a continuous film on copper but dewetting and droplet formation on SiO$_2$, as shown in FIGS. 2A, 2B and 2C. The spin coating method of the present disclosure may have a predetermined spinning rate for the object that is between 1,000 revolutions per minute (RPM) and 10,000 RPM.

Figure 2D:
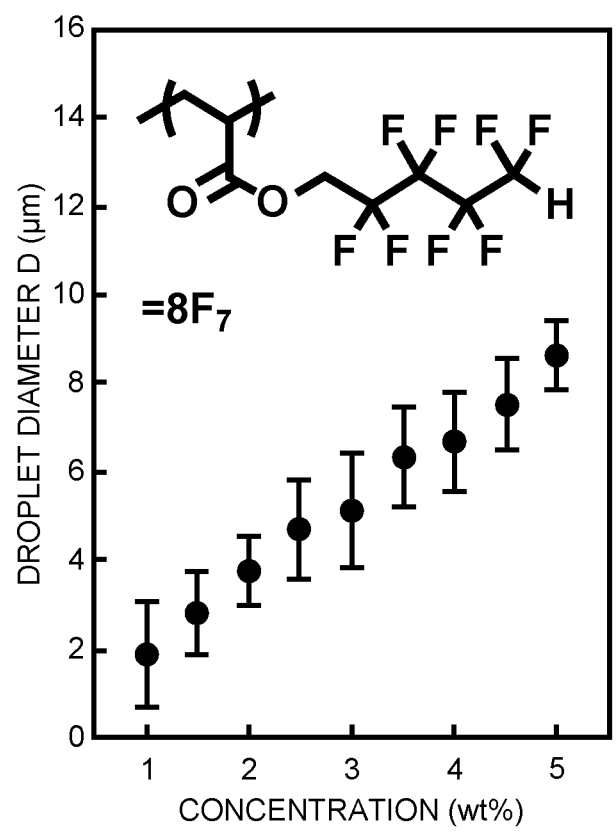
FIG. 2D is a diagram showing spin coating of $8F_7$ on homogeneous substrates, in which the average diameter (D) of the dewet droplets on $SiO_2$ substrate increases with casting solution concentration.

FIG. 2D is a diagram showing spin coating of 8F$_7$ on homogeneous substrates, in which the average diameter of the dewet droplets on SiO$_2$ substrate increases with casting solution concentration. The spin coating conditions were as follows: 8F$_7$ in trifluoroethanol, 10 krpm, (FIGS. 2A and 2B) 5.0 wt % and (FIG. 2D) varying concentrations. Error bars in FIG. 2D arise from a combination of variations between three spin coating experiments and area-averaged droplet sizes within each experiment. ImageJ software was used to extract the average droplet diameter (D) and its standard deviation by assuming circularity. The droplet size is correlated with spin coating conditions, for example, solution concentration (FIG. 2D) and spin speed, as shown in FIGS. 3A, 3B, and 3C. For example, D increases from 1.9±1.2 µm at 1.0 wt % in trifluoroethanol to 8.6±0.8 µm at 5.0 wt %.

Spin coating 8F$_7$ onto a Cu/SiO$_2$ interdigitated pattern with P=10 µm demonstrates that the resulting selectivity exhibits a pronounced dependence on coating conditions: concentration and spin speed. Importantly, this relationship universally collapses as the ratio D/P, where D is the average droplet size formed by $8F_7$ when it dewets on homogeneous $SiO_2$, and P is the pitch periodicity of the heterogeneous surface line-space pattern. Three regimes of selectivity are evident, as shown in FIG. 4A: (1) D/P<0.5 creates dewetted droplets 20 that are too small and they cannot all migrate from $SiO_2$ to copper. Consequently, while copper is entirely covered by a wetted coating 22 of polymer, residual droplets 20 are also observed on $SiO_2$, as shown in FIGS. 4B and 4E. (2) D/P≈0.5 has approximately matched droplet and pattern dimensions that result in selective deposition with excellent fidelity as evidenced by optical microscopy (FIGS. 4C and 4F), atomic force microscopy (AFM; FIGS. 5A to 5C), and secondary ion mass spectrometry (SIMS; FIG. 4H and 4I). (3) D/P>0.5 again becomes partially non-selective because the large droplet size creates polymer bridges between copper lines, as shown in FIGS. 4D and 4G. Spin coating conditions were as follows: $8F_7$ in trifluoroethanol, 3.0 wt %, 10 krpm for FIGS. 5A and 5B, which corresponds to the data in FIGS. 4F, 4I, and the $SiO_2$ of 6C. In addition, spin coating conditions were as follows: $8F_7$ in trifluoroethanol, 10 krpm, (FIG. 4E) 1.0 wt %, (FIG. 4F) 3.0 wt %, (FIG. 4G) 3.5 wt %, and (FIG. 4I) 3.0 wt %. Polymer coverage on copper and $SiO_2$ in FIGS. 4E to 4G was calculated by ImageJ processing. Elemental mapping in FIG. 4H and FIG. 4I was measured by SIMS. All the scale bars are 20 μm.

These preliminary studies indicate polymer design can indeed promote selective spin-dewetting without surface preconditioning or postprocessing. To further illustrate the predictive power of the D/P ratio, $8F_7$ coverage on copper and $SiO_2$ was next probed across a series of prepattern pitch dimensions: P=40 μm (FIG. 6A), 20 μm (FIG. 6B), and 10 μm (FIG. 6C), all of which have about the same copper line thickness of 15 nm (FIG. 5A to 5C and FIGS. 7A to 7D). As described in FIG. 2D, the droplet size was systematically varied by changing solution concentration, and coverage was extracted from optical micrographs using ImageJ. Coverage on copper is 100% in most cases except with lower concentrations at P=40 μm, which is ascribed to the slight dewetting of $8F_7$ even on a homogeneous copper substrate under these conditions, as shown in FIGS. 8A and 8B. In contrast, coverage on $SiO_2$ depends sensitively on concentration at different pitch dimensions. To quantify selectivity, a selectivity index is defined as follows:

$$S = 1 - \frac{\text{coverage (SiO}_2\text{)}}{\text{coverage (Cu)}} \quad (1)$$

such that S=1 when selectivity is perfect and S=0 if $SiO_2$ and copper are equally covered by polymer. FIG. 6D shows how the selectivity index depends on D/P using all of the data from FIGS. 6A to C, that is, across many different droplet sizes at three different pitches. S passes through a maximum near D/P=0.5, which corresponds to the data in FIGS. 4F, 4H, 4I, and 6C (3.0 wt % solution concentration). Spin coating conditions were as follows: $8F_7$ in trifluoroethanol, 10 krpm, varying concentrations. Polymer coverage on copper and $SiO_2$ in FIGS. 6A to 6C was calculated by ImageJ processing. Error bars in FIGS. 6A to 6C arise from variations between three spin coating experiments. Error bars in FIG. 6D were removed for clarity. Plots with error bars are available in FIG. 10B. To further corroborate this relationship, D was also varied by changing spin speed for all three pitch dimensions, as shown in FIGS. 9A to 9D; again, S=1 at D/P=0.5 and decreases at larger and smaller droplet sizes, as shown in 9A to 9D. Importantly, S≈1 is obtainable for a variety of D/P centered around 0.5 and is not limited to an overly narrow range of spin coating conditions. Spin coating conditions were as follows: $8F_7$ in trifluoroethanol, 3.0 wt %, varying spin speeds. Polymer coverage on copper and $SiO_2$ in FIGS. 9A to 9C was calculated by ImageJ processing. Error bars have been removed from FIG. 6D for clarity; full error analysis derived from replicate samples can be found in FIG. 10B. More importantly, a selectivity index=1 is obtainable for a range of D/P and is not limited to just one single spin coating condition. Combined plots of concentration and spin speed data are without (FIG. 10A) and with (FIG. 10B) error bars.

Next, the selectivity rules described previously for $8F_7$ were generalized using a series of semi-fluorinated poly (acrylates) denoted as $zF_n$, where z indicates the number of fluorine atoms per monomer repeat unit and n is the degree of polymerization. The general strategy is the same as previously. Quantitatively understanding the dependence of D on concentration and spin speed, which can vary for different chemistry, allows tuning D to achieve D/P≈0.5 and selective deposition. Note some interesting peculiarities distinguish the spin coating behavior of these semi-fluorinated poly(acrylates) from more conventional polymers. In traditional spin coating, increasing solution concentration or polymer molecular weight affects resultant film characteristics in the same way because they collapse to one fundamental parameter, solution viscosity. However, increasing solution concentration and polymer molecular weight modulate D in opposite ways for the semi-fluorinated poly(acrylates); D decreases with larger molecular weight (FIGS. 11A to 11D) but increases with concentration (FIG. 2D). Spin coating conditions were as following: FIG. 11A, $8F_7$, $8F_{15}$ (poly(1H,1H,5H-octafluoropentyl acrylate), degree of polymerization=15), and $8F_{30}$ (poly(1H,1H,5H-octafluoropentyl acrylate), degree of polymerization=30) in trifluoroethanol, 10 krpm, varying concentration; FIGS. 11B to 11D, respectively, $8F_7$, $8F_{15}$, and $8F_{30}$ in trifluoroethanol, 1.0 wt %, 10 krpm. Droplet size in FIG. 11A was calculated by ImageJ processing. All the scale bars are 20 μm. By understanding how D depends on solution concentration and spin speed, D can be co-optimized with P to achieve D/P≈0.5. For example, $3F_7$ (poly(2,2,2-trifluoroethyl acrylate), degree of polymerization=7), $4F_7$ (poly(2,2,3,3-tetrafluoropropyl acrylate), degree of polymerization=7), and $8F_{15}$ all wet homogeneous copper and dewet from $SiO_2$ (FIGS. 12A to 12I), similar to $8F_7$ (FIG. 2D). Spin coating conditions were as follows: For FIGS. 12B and 12C, $3F_7$ in trifluoroethanol, 3.0 wt %, 10 krpm; for FIGS. 12E and 12D, $4F_7$ in trifluoroethanol, 3.0 wt %, 10 krpm, and all the scale bars are 20 μm; for FIGS. 12H and 12I, $8F_{15}$ in trifluoroethanol, 3.0 wt %, 10 krpm, and all the scale bars are 20 μm. For $8F_{15}$ and $3F_7$, selective deposition was achieved near D/P=0.5, as shown in FIGS. 13A to 13F. Spin coating conditions were as follows: For FIGS. 13B and 13C, $8F_{15}$ in trifluoroethanol, 6 krpm, 5.0 wt %; for FIGS. 13E and 13F, $3F_7$ in trifluoroethanol, 10 krpm, 2.0 wt %. All the scale bars are 20 μm. Interestingly, this approach cannot be used for any arbitrary m and n. A fourth polymer, $13F_7$ (poly(1H,1H,2H,2H-perfluorooctyl acrylate), degree of polymerization=7), dewets from both homogeneous copper and $SiO_2$, and consequently, spin coating it on Cu/$SiO_2$ line-space patterns results in dewetting everywhere, that is, in no selectivity, as shown in FIGS. 14A to 14F. Spin coating conditions were as follows: $13F_7$ in trifluoroethanol, 3.0 wt %, 10 krpm for all. All the scale bars are 20 μm. This behavior is tentatively ascribed to the high fluorine content, which also confirms the general polymer design criterion outlined previously: namely, selective deposition is achieved when one substrate material is coated while the other promotes dewetting. Finally, control experiments using non-fluorinated acrylate-based oligomers have failed to find selectivity in any case, even though low molecular weights might be expected to induce dewetting, perhaps preferentially, as shown in FIGS. 15A to 15F. The presence of fluorine substituents in the $zF_n$ series of polymers plays a crucial role in promoting preferential dewetting and selective deposition.

When spun cast from trifluoroethanol onto homogeneous substrates, $0F_7$ dewets copper to form holes in films and dewets $SiO_2$ to form irregular threads. On line patterns, although 0F7 seems to prefer copper to $SiO_2$, the coverage on copper is poor.

Selectivity in the present context is driven by wettability contrast between the polymer and heterogeneous surfaces. Ideally, this difference would be drastic, that is, polymer perfectly wets one material and completely dewets from the other. In reality, the system can tolerate some small degree of dewetting on copper and still show good selectivity. Hole formation on homogeneous copper was observed under some spin coating conditions, where copper coverage remains 100% on heterogeneous patterns, as shown in FIGS. 16A and 16B. Spin coating conditions were as follows: $8F_7$ in trifluoroethanol, 3.0 wt %, 4 krpm for both. The ratio D/P is also clearly correlated with good selectivity but may not represent the most predictive indicator. For example, while the lines and spaces of the 20 μm and 40 μm full-pitch patterns are approximately equal in width, the 10 μm pattern has significantly wider copper lines than $SiO_2$ gaps, as shown in FIGS. 17A to 17C; D/P≈0.5 therefore has no direct physical interpretation. The process used to make these patterns also necessarily creates slight surface topography (copper lines are approximately 15 nm thick), the role of which cannot yet be disentangled from interfacial interaction effects. Regardless, the simple ratio D/P provides many useful insights into SAM-free spin dewetting and is strongly correlated with selective deposition, as shown in FIGS. 18A to 18C, comprehensive plots including all studies of the present disclosure.

A brief comment regarding resolution limitations of this SAM-free spin dewetting process is worthwhile. To maintain a D/P ratio near 0.5 at high resolutions demands decreasing D linearly with the pitch dimensions. This may be possible with the $zF_n$ poly(acrylate) material platform. As shown previously with the $8F_n$ series of polymers, moving from $8F_7$ to $8F_{15}$ and $8F_{30}$ drastically decreases D at similar solution concentrations (FIGS. 11A to 11D) and spin speeds (FIGS. 19A to 19C). Spin coating conditions were as follows: $8F_{15}$, in trifluoroethanol, (FIG. 19A) 2 krpm, (FIG. 19B) 5 krpm, and (FIG. 19C) 10 krpm. All the scale bars are 20 μm. An even higher molecular weight polymer—$4F_{200}$, poly(2,2,3,3-tetrafluoropropyl acrylate), degree of polymerization=200—showed a droplet size of 230 nm at a concentration of 0.2 wt % in trifluoroethanol as shown in FIG. 20C. Spin coating conditions were as follows: $4F_{200}$, in trifluoroethanol, 10 krpm, (FIG. 20B) 1.0 wt %, (FIG. 20C) 0.2 wt %.

In summary, a SAM-free single-step selective deposition approach has been developed that is enabled by polymer design instead of substrate preconditioning. The incorporation of fluorine into acrylate polymers/oligomers induces preferential dewetting on $SiO_2$ versus copper. Spin coating these materials onto the heterogeneous line-space patterns produces selective deposition on copper in under one minute. Selectivity is controlled by the ratio of droplet diameter formed after dewetting on homogeneous $SiO_2$ (D) to the half-pitch dimension (P) of the line-space patterns. D/P≈0.5 produces selective deposition with good pattern fidelity as evidenced by optical microscopy and SIMS analysis across a library of polymers with different molecular weights and monomer structures. These results provide insights into a self-aligned patterning technique that will prove useful for thin-film applications requiring overlay control or those which leverage the unusual attributes of fluorinated polymers, for example, their low surface energy, reduced friction, low refractive index, high thermal stability, chemical resistance, and weatherability.

Materials

All commercially obtained reagents were used as received unless mentioned otherwise.

Substrates: Homogeneous copper and $SiO_2$ wafers were purchased from University Wafers and used as received. Copper lines on $SiO_2$ wafers were patterned by standard photolithography using lift-off.

Monomers: 2,2,2-trifluoroethyl acrylate (3F) was purchased from Oakwood Products Inc. 2,2,3,3-tetrafluoropropyl acrylate (4F) was purchased from TCI America. 1H,1H,5H-Octafluoropentyl acrylate (8F) and 1H,1H,2H,2H-perfluorooctyl acrylate (13F) were purchased from SynQuest Laboratories Inc. Methyl acrylate (0F) was purchased from Sigma Aldrich. All monomers were filtered through a plug of basic alumina before use.

Solvents: 2,2,2-Trifluoroethanol was purchased from Oakwood Products Inc. 2,2,3,3-Tetrafluoropropan-1-ol, 1H,1H,5H-octafluoropentan-1-ol, and 2-(trifluoromethyl)propan-2-ol (TFMP) were purchased from SynQuest Laboratories Inc. Anhydrous toluene and dimethyl sulfoxide were purchased from Sigma Aldrich.

ATRP Agents: $CuBr_2$ and ethyl 2-bromoisobutyrate (EBiB) were purchased from Sigma-Aldrich. Tris[2-(dimethylamino)ethyl]amine ($Me_6$-TREN) was purchased from Alfa Aesar. Dialysis tubing was Spectra/Por regenerated cellulose and purchased from Spectrum Laboratories Inc. through VWR.

Semi-Fluorinated and Non-Fluorinated Oligomers: All syntheses were done according to literature procedures. Oligomers $8F_7$, $8F_{15}$, and $8F_{30}$ were all synthesized in 1H,1H,5H-octafluoropentan-1-ol. Oligomers $4F_7$ and $4F_{200}$ were both synthesized in 2,2,3,3-tetrafluoropropan-1-ol. Oligomers $0F_4$, $3F_7$, and $13F_7$ were synthesized in dimethyl sulfoxide, 2,2,2-trifluoroethanol, and 2-(trifluoromethyl)propan-2-ol, respectively.

Table 1 shows the molar mass dispersities of all the oligomers studied in the present disclosure.

TABLE 1

| Oligomer | Đ* |
|---|---|
| $8F_7$ | 1.22 |
| $8F_{15}$ | 1.16 |
| $8F_{30}$ | 1.17 |
| $0F_7$ | 1.56 |
| $3F_7$ | 1.59 |
| $4F_7$ | 1.34 |
| $13F_7$ | 1.15 |
| $4F_{200}$ | 1.15 |

*Đ was determined by size exclusion chromatography relative to polystyrene standards using chloroform as an eluent on a Waters Acquity Advanced Polymer Characterization System equipped with an Acquity UPLC refractive index detector.

Spin Coating Conditions

Generally, an 8 μL droplet of polymer solution was dispensed by a micropipette onto the substrate and immediately spun at varying spin speeds (4 to 10 krpm) for 30 s using a 6800 Spin Coater (Specialty Coating Systems, USA). However, spin conditions may be as long as 60 s. The specific concentrations, spin speeds, and polymers are specified in the specification. Every spin coating experiment was conducted three times to study the variations and obtain error bars.

Surface Characterization

SIMS imaging was performed using a Camera IMS 7f system (Camera SAS, Gennevilliers, France) with a 15 keV cesium beam on an analytical area of 200 μm$^2$ by monitoring $^{28}$Si and $^{12}$C signals. Tapping mode (AFM) experiments were performed using a Multimode system (Veeco, USA) to investigate the surface. Measurements were conducted using commercial silicon cantilevers (resonant frequency: 190 kHz; force constant: 48 N/m; model: Tap190AI-G, Nano-AndMore USA). Polymer film thickness on homogeneous surfaces was determined by an alpha-SE spectroscopic ellipsometer (J.A. Woollam Co.) or a DektakXT Stylus Profilometer (Bruker Corporation). Optical micrographs were captured with an Olympus BX51 optical microscope in reflectance mode.

FIG. 21 shows the chemical structures of all the oligomers presented in the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A method of coating comprising:
   providing an object made of a metal and a dielectric, wherein the metal has a line-space pattern with a predetermined half-pitch dimension P;
   providing a polymer solution that forms dewetted droplets with an average diameter D when spin coated onto a homogeneous surface from which it dewets, wherein a polymer comprising the polymer solution causes D to be less than P;
   dispensing the polymer solution onto the object; and
   spinning the object at a predetermined number of revolutions per minute (RPM) no more than 30 seconds after dispensing the polymer solution onto the object.

2. The method of coating of claim 1 wherein the metal is copper and the dielectric is silicon dioxide.

3. The method of claim 1 wherein the polymer solution comprises a solvent and a polymer.

4. The method of claim 3 wherein the polymer comprises a poly(acrylate) containing at least one semi-fluorinated pendant group.

5. The method of claim 3 wherein the solvent is trifluoroethanol.

6. The method of claim 3 wherein the polymer is an oligomer.

7. The method of claim 6 wherein the oligomer is $8F_7$: poly(1H,1H,5H-octafluoropentyl acrylate).

8. The method of claim 6 wherein the oligomer is $8F_{15}$: poly(1H,1H,5H-octafluoropentyl acrylate).

9. The method of claim 6 wherein the oligomer is $8F_{30}$: poly(1H,1H,5H-octafluoropentyl acrylate).

10. The method of claim 6 wherein the oligomer is $0F_7$: poly(methyl acrylate).

11. The method of claim 6 wherein the oligomer is $3F_7$: poly(2,2,2-trifluoroethyl acrylate).

12. The method of claim 6 wherein the oligomer is $4F_7$: poly(2,2,3,3-tetrafluoropropyl acrylate).

13. The method of claim 6 wherein the oligomer is $13F_7$: poly(1H,1H,2H,2H-perfluorooctyl acrylate).

14. The method of claim 6 wherein the oligomer is $4F_{200}$: poly(2,2,3,3-tetrafluoropropyl acrylate).

15. The method of claim 1 wherein the predetermined RPM is between 1000 RPM and 10,000 RPM.

16. The method of claim 1 wherein a D/P ratio is between 0.40 and 0.65.

* * * * *